(12) United States Patent
Myli et al.

(10) Patent No.: US 7,820,296 B2
(45) Date of Patent: Oct. 26, 2010

(54) LOW-MAINTENANCE COATING TECHNOLOGY

(75) Inventors: Kari B. Myli, Sauk City, WI (US);
Annette J. Krisko, Sauk City, WI (US);
John German, Prairie Du Sac, WI (US);
Klaus Hartig, Avoca, WI (US)

(73) Assignee: Cardinal CG Company, Eden Prairie, MN (US)

( * ) Notice: Subject to any disclaimer, the term of this patent is extended or adjusted under 35 U.S.C. 154(b) by 0 days.

(21) Appl. No.: 12/209,788

(22) Filed: Sep. 12, 2008

(65) Prior Publication Data
US 2009/0075067 A1    Mar. 19, 2009

Related U.S. Application Data

(60) Provisional application No. 60/972,527, filed on Sep. 14, 2007, provisional application No. 61/039,760, filed on Mar. 26, 2008.

(51) Int. Cl.
*B32B 17/06* (2006.01)
(52) U.S. Cl. .................. 428/432; 428/428; 428/689; 428/697; 428/701; 428/702
(58) Field of Classification Search .............. 428/428, 428/432, 689, 697, 701, 702
See application file for complete search history.

(56) References Cited

U.S. PATENT DOCUMENTS

| | | | |
|---|---|---|---|
| 4,166,018 A | 8/1979 | Chapin |
| 4,556,599 A | 12/1985 | Sato |
| 4,663,234 A | 5/1987 | Bouton |
| 4,692,428 A | 9/1987 | Murrell |
| 4,838,935 A | 6/1989 | Dunlop |
| 4,854,670 A | 8/1989 | Mellor |
| 4,883,574 A | 11/1989 | dos Santos Pereina Ribeiro |
| 4,902,580 A | 2/1990 | Gillery |
| 4,931,315 A | 6/1990 | Mellor |
| 4,940,636 A | 7/1990 | Brock |
| 4,954,465 A | 9/1990 | Kawashima |
| 4,963,240 A | 10/1990 | Fukasawa |
| 4,995,893 A | 2/1991 | Jenkins |

(Continued)

FOREIGN PATENT DOCUMENTS

EP    0285130    10/1988

(Continued)

OTHER PUBLICATIONS

C. Ang et al., "Deposition of high stability thin film ternary alloy resistors by sputtering," In: International conf. on Vacuum Metallurgy, 4th, Tokyo, Japan Jun. 4-8, 1973.

(Continued)

*Primary Examiner*—Gwendolyn Blackwell
(74) *Attorney, Agent, or Firm*—Fredrikson & Byron, P.A.

(57) ABSTRACT

The invention provides a substrate bearing a low-maintenance coating. In some embodiments, the coating includes a low-maintenance film that includes a thickness of film comprising titania, wherein only part of that thickness includes tungsten. The thickness includes an inner portion and an outer portion, the outer portion being the part that includes tungsten. The invention also provides methods and equipment for depositing such coatings.

29 Claims, 21 Drawing Sheets

U.S. PATENT DOCUMENTS

| | | |
|---|---|---|
| 4,997,576 A | 3/1991 | Heller |
| 5,006,248 A | 4/1991 | Anderson |
| 5,035,784 A | 7/1991 | Anderson |
| 5,047,131 A | 9/1991 | Wolfe |
| 5,073,451 A | 12/1991 | Iida |
| 5,104,539 A | 4/1992 | Anderson |
| 5,110,637 A | 5/1992 | Ando |
| 5,160,534 A | 11/1992 | Hiraki |
| 5,168,003 A | 12/1992 | Proscia |
| 5,176,897 A | 1/1993 | Lester |
| 5,179,468 A | 1/1993 | Gasloli |
| 5,234,487 A | 8/1993 | Wickersham |
| 5,298,048 A | 3/1994 | Lingle |
| 5,298,338 A | 3/1994 | Hiraki |
| 5,306,569 A | 4/1994 | Hiraki |
| 5,318,830 A | 6/1994 | Takamatsu |
| 5,356,718 A | 10/1994 | Athey |
| 5,397,050 A | 3/1995 | Mueller |
| 5,417,827 A | 5/1995 | Finley |
| 5,470,527 A | 11/1995 | Yamanobe |
| 5,496,621 A | 3/1996 | Makita |
| 5,512,152 A | 4/1996 | Schicht |
| 5,513,039 A | 4/1996 | Lu |
| 5,514,485 A | 5/1996 | Ando |
| 5,525,406 A | 6/1996 | Goodman |
| 5,527,755 A | 6/1996 | Wenski |
| 5,552,180 A | 9/1996 | Finley |
| 5,569,362 A | 10/1996 | Lerbet |
| 5,595,813 A | 1/1997 | Ogawa |
| 5,635,287 A | 6/1997 | Balian |
| 5,679,978 A | 10/1997 | Kawahara |
| 5,686,372 A | 11/1997 | Langford |
| 5,715,103 A | 2/1998 | Amano |
| 5,744,215 A | 4/1998 | Neuman |
| 5,780,149 A | 7/1998 | McCurdy |
| 5,780,380 A | 7/1998 | Endoh |
| 5,811,191 A | 9/1998 | Neuman |
| 5,812,405 A | 9/1998 | Meredith, Jr. |
| 5,827,490 A | 10/1998 | Jones |
| 5,830,252 A | 11/1998 | Finley |
| 5,854,169 A | 12/1998 | Heller |
| 5,854,708 A | 12/1998 | Komatsu |
| 5,863,398 A | 1/1999 | Kardokus |
| 5,869,187 A | 2/1999 | Nakamura |
| 5,871,843 A | 2/1999 | Yoneda |
| 5,873,203 A | 2/1999 | Thiel |
| 5,874,701 A | 2/1999 | Watanabe |
| 5,877,391 A | 3/1999 | Kanno |
| 5,896,553 A | 4/1999 | Lo |
| 5,897,957 A | 4/1999 | Goodman |
| 5,935,716 A | 8/1999 | McCurdy |
| 5,939,188 A | 8/1999 | Moncur |
| 5,939,201 A | 8/1999 | Boire |
| 5,948,538 A | 9/1999 | Brochot |
| 5,981,426 A | 11/1999 | Langford |
| 5,993,734 A | 11/1999 | Snowman |
| 6,013,372 A | 1/2000 | Hayakawa |
| 6,027,766 A | 2/2000 | Greenberg |
| 6,037,289 A | 3/2000 | Chopin |
| 6,040,939 A | 3/2000 | Demiryont |
| 6,054,227 A | 4/2000 | Greenberg |
| 6,068,914 A | 5/2000 | Boire |
| 6,071,606 A | 6/2000 | Yamazaki |
| 6,071,623 A | 6/2000 | Sugawara |
| 6,074,981 A | 6/2000 | Tada |
| 6,077,482 A | 6/2000 | Kanno |
| 6,077,492 A | 6/2000 | Anpo |
| 6,090,489 A | 7/2000 | Hayakawa |
| 6,103,363 A | 8/2000 | Boire |
| 6,120,747 A | 9/2000 | Sugishima |
| 6,139,803 A | 10/2000 | Watanabe |
| 6,139,968 A | 10/2000 | Knapp |
| 6,153,067 A | 11/2000 | Maishev |
| 6,154,311 A | 11/2000 | Simmons, Jr. |
| 6,156,409 A | 12/2000 | Doushita |
| 6,165,256 A | 12/2000 | Hayakawa |
| 6,179,971 B1 | 1/2001 | Kittrell |
| 6,179,972 B1 | 1/2001 | Kittrell |
| 6,193,378 B1 | 2/2001 | Tonar |
| 6,193,856 B1 | 2/2001 | Kida |
| 6,194,346 B1 | 2/2001 | Tada |
| 6,228,480 B1 | 5/2001 | Kimura |
| 6,228,502 B1 | 5/2001 | Saitoh |
| 6,238,738 B1 | 5/2001 | McCurdy |
| 6,242,752 B1 | 6/2001 | Soma |
| 6,248,397 B1 | 6/2001 | Ye |
| 6,274,244 B1 | 8/2001 | Finley |
| 6,299,981 B1 | 10/2001 | Azzopardi |
| 6,319,326 B1 | 11/2001 | Koh |
| 6,326,079 B1 | 12/2001 | Philippe |
| 6,329,060 B1 | 12/2001 | Barkac |
| 6,334,938 B2 | 1/2002 | Kida |
| 6,335,479 B1 | 1/2002 | Yamada |
| 6,336,998 B1 | 1/2002 | Wang |
| 6,337,124 B1 | 1/2002 | Anderson |
| 6,346,174 B1 | 2/2002 | Finley |
| 6,352,755 B1 | 3/2002 | Finley |
| 6,362,121 B1 | 3/2002 | Chopin |
| 6,365,014 B2 | 4/2002 | Finley |
| 6,368,664 B1 | 4/2002 | Veerasamy |
| 6,368,668 B1 | 4/2002 | Kobayashi |
| 6,379,776 B1 | 4/2002 | Tada |
| 6,387,844 B1 | 5/2002 | Fujishima |
| 6,413,581 B1 | 7/2002 | Greenberg |
| 6,414,213 B2 | 7/2002 | Ohmori |
| 6,425,670 B1 | 7/2002 | Komatsu |
| 6,436,542 B1 | 8/2002 | Ogino |
| 6,440,278 B1 | 8/2002 | Kida |
| 6,461,686 B1 | 10/2002 | Vanderstraeten |
| 6,464,951 B1 | 10/2002 | Kittrell |
| 6,465,088 B1 | 10/2002 | Talpaert |
| 6,468,402 B1 | 10/2002 | Vanderstraeten |
| 6,468,403 B1 | 10/2002 | Shimizu |
| 6,468,428 B1 | 10/2002 | Nishii |
| 6,511,587 B2 | 1/2003 | Vanderstraeten |
| 6,570,709 B2 | 5/2003 | Katayama |
| 6,576,344 B1 | 6/2003 | Doushita |
| 6,582,839 B1 | 6/2003 | Yamamoto |
| 6,596,664 B2 | 7/2003 | Kittrell |
| 6,635,155 B2 | 10/2003 | Miyamura |
| 6,673,738 B2 | 1/2004 | Ueda |
| 6,677,063 B2 | 1/2004 | Finley |
| 6,679,978 B2 | 1/2004 | Johnson |
| 6,680,135 B2 | 1/2004 | Boire |
| 6,716,323 B1 | 4/2004 | Siddle |
| 6,720,066 B2 | 4/2004 | Talpaert |
| 6,722,159 B2 | 4/2004 | Greenberg |
| 6,730,630 B2 | 5/2004 | Okusako |
| 6,733,889 B2 | 5/2004 | Varanasi |
| 6,743,343 B2 | 6/2004 | Kida |
| 6,743,749 B2 | 6/2004 | Morikawa |
| 6,761,984 B2 * | 7/2004 | Anzaki et al. ............... 428/697 |
| 6,770,321 B2 | 8/2004 | Hukari |
| 6,777,030 B2 | 8/2004 | Veerasamy |
| 6,781,738 B2 | 8/2004 | Kikuchi |
| 6,787,199 B2 | 9/2004 | Anpo |
| 6,789,906 B2 | 9/2004 | Tonar |
| 6,794,065 B1 | 9/2004 | Morikawa |
| 6,800,182 B2 | 10/2004 | Mitsui |
| 6,800,354 B2 | 10/2004 | Baumann |
| 6,804,048 B2 | 10/2004 | MacQuart |
| 6,811,856 B2 | 11/2004 | Nun |
| 6,818,309 B1 | 11/2004 | Talpaert |
| 6,829,084 B2 | 12/2004 | Takaki |

| | | | | | |
|---|---|---|---|---|---|
| 6,830,785 B1 | 12/2004 | Hayakawa | 2003/0186089 A1 | 10/2003 | Kikuchi |
| 6,833,089 B1 | 12/2004 | Kawahara | 2003/0207028 A1 | 11/2003 | Boire |
| 6,835,688 B2 | 12/2004 | Morikawa | 2003/0215647 A1 | 11/2003 | Yoshida |
| 6,840,061 B1 | 1/2005 | Hurst | 2003/0224620 A1 | 12/2003 | Kools |
| 6,846,556 B2 | 1/2005 | Boire | 2003/0235720 A1 | 12/2003 | Athey |
| 6,869,644 B2 | 3/2005 | Buhay | 2004/0005466 A1 | 1/2004 | Arai |
| 6,870,657 B1 | 3/2005 | Fitzmaurice | 2004/0009356 A1 | 1/2004 | Medwick |
| 6,872,441 B2 | 3/2005 | Baumann | 2004/0043260 A1 | 3/2004 | Nadaud |
| 6,875,319 B2 | 4/2005 | Nadaud | 2004/0069623 A1 | 4/2004 | Vanderstraeten |
| 6,878,242 B2 | 4/2005 | Wang | 2004/0115362 A1 | 6/2004 | Hartig |
| 6,878,450 B2 | 4/2005 | Anpo | 2004/0140198 A1 | 7/2004 | Cho |
| 6,881,701 B2 | 4/2005 | Jacobs | 2004/0149307 A1 | 8/2004 | Hartig |
| 6,890,656 B2 | 5/2005 | Iacovangelo | 2004/0179978 A1 | 9/2004 | Kobayashi |
| 6,908,698 B2 | 6/2005 | Yoshida | 2004/0180216 A1 | 9/2004 | Veerasamy |
| 6,908,881 B1 | 6/2005 | Sugihara | 2004/0180220 A1 | 9/2004 | Gueneau |
| 6,916,542 B2 | 7/2005 | Buhay | 2004/0196580 A1 | 10/2004 | Nakaho |
| 6,929,862 B2 | 8/2005 | Hurst | 2004/0202890 A1 | 10/2004 | Kutilek |
| 6,939,611 B2 | 9/2005 | Fujishima | 2004/0206024 A1 | 10/2004 | Graf |
| 6,952,299 B1 | 10/2005 | Fukazawa | 2004/0214010 A1 | 10/2004 | Murata |
| 6,954,240 B2 | 10/2005 | Hamamoto | 2004/0216487 A1 | 11/2004 | Boire |
| 6,962,759 B2 | 11/2005 | Buhay | 2004/0219348 A1 | 11/2004 | Jacquiod |
| 6,964,731 B1 | 11/2005 | Krisko | 2004/0241040 A1 | 12/2004 | Wei |
| 6,997,570 B2 | 2/2006 | Nakaho | 2004/0241490 A1 | 12/2004 | Finley |
| 7,005,188 B2 | 2/2006 | Anderson | 2004/0247901 A1 | 12/2004 | Suzuki |
| 7,005,189 B1 | 2/2006 | Tachibana | 2004/0248725 A1 | 12/2004 | Hiraoka |
| 7,011,691 B2 | 3/2006 | Abe | 2004/0253382 A1 | 12/2004 | De Bosscher |
| 7,022,416 B2 | 4/2006 | Teranishi | 2004/0253471 A1 | 12/2004 | Thiel |
| 7,049,002 B2 | 5/2006 | Greenberg | 2005/0003672 A1 | 1/2005 | Kools |
| 7,052,585 B2 | 5/2006 | Veerasamy | 2005/0016835 A1 | 1/2005 | Krisko |
| 7,060,643 B2 | 6/2006 | Sanbayashi | 2005/0019505 A1 | 1/2005 | Hamamoto |
| 7,096,692 B2 | 8/2006 | Greenberg | 2005/0019700 A1 | 1/2005 | Hayakawa |
| 7,118,936 B2 | 10/2006 | Kobayashi | 2005/0020444 A1 | 1/2005 | Hiraoka |
| 7,138,181 B2 | 11/2006 | McCurdy | 2005/0025982 A1 | 2/2005 | Krisko |
| 7,157,840 B2 | 1/2007 | Fujishima | 2005/0031876 A1 | 2/2005 | Lu |
| 7,175,911 B2 | 2/2007 | Zhou | 2005/0042375 A1 | 2/2005 | Minami |
| 7,179,527 B2 | 2/2007 | Sato | 2005/0044894 A1 | 3/2005 | Nelson |
| 7,195,821 B2 | 3/2007 | Tixhon | 2005/0051422 A1 | 3/2005 | Rietzel |
| 7,198,699 B2 | 4/2007 | Thomsen | 2005/0084688 A1 | 4/2005 | Garrec |
| 7,211,513 B2 | 5/2007 | Remington, Jr. | 2005/0137084 A1 | 6/2005 | Krisko |
| 7,211,543 B2 | 5/2007 | Nakabayashi | 2005/0191505 A1 | 9/2005 | Akarsu |
| 7,223,523 B2 | 5/2007 | Boykin | 2005/0191522 A1 | 9/2005 | Anzaki |
| 7,232,615 B2 | 6/2007 | Buhay | 2005/0221098 A1 | 10/2005 | Azzopardi |
| 7,255,831 B2 | 8/2007 | Wei | 2005/0227008 A1 | 10/2005 | Okada |
| 7,261,942 B2 | 8/2007 | Andrews | 2005/0233893 A1 | 10/2005 | Sakatani |
| 7,264,741 B2 | 9/2007 | Hartig | 2005/0233899 A1 | 10/2005 | Anzaki |
| 7,294,365 B2 | 11/2007 | Hayakawa | 2005/0238861 A1 | 10/2005 | Buhay |
| 7,294,404 B2 | 11/2007 | Krisko | 2005/0245382 A1 | 11/2005 | Iwahashi |
| 7,300,634 B2 | 11/2007 | Yaniv | 2005/0245383 A1 | 11/2005 | Iwahashi |
| 7,309,405 B2 | 12/2007 | Cho | 2005/0247555 A1 | 11/2005 | Thiel |
| 7,309,664 B1 | 12/2007 | Marzolin | 2005/0248824 A1 | 11/2005 | Fukazawa |
| 7,311,961 B2 | 12/2007 | Finley | 2005/0252108 A1 | 11/2005 | Sanderson |
| 7,320,827 B2 | 1/2008 | Fujisawa | 2005/0258030 A1 | 11/2005 | Finley |
| 7,323,249 B2 | 1/2008 | Athey | 2005/0266248 A1 | 12/2005 | Millero |
| 7,348,054 B2 | 3/2008 | Jacquiod | 2005/0272590 A1 | 12/2005 | Iwahashi |
| 7,354,624 B2 | 4/2008 | Millero | 2006/0003545 A1 | 1/2006 | Veerasamy |
| 7,361,963 B2 | 4/2008 | Ikadai | 2006/0011945 A1 | 1/2006 | Spitzer-Keller |
| 7,387,839 B2 | 6/2008 | Gueneau | 2006/0014027 A1 | 1/2006 | Oudard |
| 2001/0030808 A1 | 10/2001 | Komatsu | 2006/0014050 A1 | 1/2006 | Gueneau |
| 2002/0012779 A1 | 1/2002 | Miyashita | 2006/0019104 A1 | 1/2006 | Hurst |
| 2002/0016250 A1 | 2/2002 | Hayakawa | 2006/0029813 A1 | 2/2006 | Kutilek |
| 2002/0028361 A1 | 3/2002 | Boire | 2006/0031681 A1 | 2/2006 | Smith |
| 2002/0071956 A1 | 6/2002 | Boire | 2006/0032739 A1 | 2/2006 | Ikeda |
| 2002/0110638 A1 | 8/2002 | Boire | 2006/0051597 A1 | 3/2006 | Anzaki |
| 2002/0119307 A1 | 8/2002 | Boire | 2006/0055513 A1 | 3/2006 | French |
| 2002/0155299 A1 | 10/2002 | Harris | 2006/0057298 A1 | 3/2006 | Krisko |
| 2002/0172775 A1 | 11/2002 | Buhay | 2006/0057401 A1 | 3/2006 | Krisko |
| 2003/0038028 A1 | 2/2003 | Schultheis | 2006/0070869 A1 | 4/2006 | Krisko |
| 2003/0039843 A1 | 2/2003 | Johnson | 2006/0090996 A1 | 5/2006 | Yaniv |
| 2003/0054177 A1 | 3/2003 | Jin | 2006/0102465 A1 | 5/2006 | Blondeel |
| 2003/0096701 A1 | 5/2003 | Fujishima | 2006/0107599 A1 | 5/2006 | Luten |
| 2003/0143437 A1 | 7/2003 | Ohtsu | 2006/0110605 A1 | 5/2006 | Luten |
| 2003/0152780 A1 | 8/2003 | Baumann | 2006/0118406 A1 | 6/2006 | Delahoy |
| 2003/0180547 A1 | 9/2003 | Buhay | 2006/0121315 A1 | 6/2006 | Myli |

| | | | | | | |
|---|---|---|---|---|---|---|
| 2006/0127604 A1 | 6/2006 | Ikadai | WO | 97/37801 | 10/1997 | |
| 2006/0134322 A1 | 6/2006 | Harris | WO | 9806675 | 2/1998 | |
| 2006/0134436 A1 | 6/2006 | Maschwitz | WO | 9911896 | 3/1999 | |
| 2006/0141290 A1 | 6/2006 | Sheel | WO | 9944954 | 9/1999 | |
| 2006/0152832 A1 | 7/2006 | Aumercier | WO | 0015571 | 2/2000 | |
| 2006/0159906 A1 | 7/2006 | Messere | WO | 0027771 | 5/2000 | |
| 2006/0165996 A1 | 7/2006 | Veerasamy | WO | 0040402 | 7/2000 | |
| 2006/0194066 A1 | 8/2006 | Ye | WO | 0075087 | 12/2000 | |
| 2006/0196765 A1 | 9/2006 | Cheng | WO | 0168786 | 9/2001 | |
| 2006/0201203 A1 | 9/2006 | Labrousse | WO | 0240417 | 5/2002 | |
| 2006/0210783 A1 | 9/2006 | Seder | WO | 0249980 | 6/2002 | |
| 2006/0210810 A1 | 9/2006 | Harris | WO | 02085809 | 10/2002 | |
| 2006/0225999 A1 | 10/2006 | Fukawa | WO | 03006393 | 1/2003 | |
| 2006/0228476 A1 | 10/2006 | McCurdy | WO | 03009061 | 1/2003 | |
| 2006/0234064 A1 | 10/2006 | Baubet | WO | 03050056 | 6/2003 | |
| 2006/0247125 A1 | 11/2006 | Choi | WO | 03062166 | 7/2003 | |
| 2006/0263610 A1 | 11/2006 | Greenberg et al. | WO | 03068500 | 8/2003 | |
| 2006/0275612 A1 | 12/2006 | Baubet | WO | 03072849 | 9/2003 | |
| 2007/0025000 A1 | 2/2007 | Lin | WO | 03087002 | 10/2003 | |
| 2007/0029187 A1 | 2/2007 | Krasnov | WO | 03087005 | 10/2003 | |
| 2007/0029527 A1 | 2/2007 | Mills | WO | 03091471 | 11/2003 | |
| 2007/0030569 A1 | 2/2007 | Lu | WO | 03093188 | 11/2003 | |
| 2007/0031593 A1 | 2/2007 | Krasnov | WO | 03095385 | 11/2003 | |
| 2007/0031681 A1 | 2/2007 | Anzaki | WO | 03097549 | 11/2003 | |
| 2007/0031682 A1 | 2/2007 | Krasnov | WO | 2004013376 | 2/2004 | |
| 2007/0042893 A1 | 2/2007 | Koike | WO | 2004034105 | 4/2004 | |
| 2007/0065670 A1 | 3/2007 | Varaprasad | WO | 2004061151 | 7/2004 | |
| 2007/0077406 A1 | 4/2007 | Jacobs | WO | 2004085699 | 10/2004 | |
| 2007/0087187 A1 | 4/2007 | Lu | WO | 2004085701 | 10/2004 | |
| 2007/0092734 A1 | 4/2007 | Durandeau | WO | 2004086104 | 10/2004 | |
| 2007/0108043 A1 | 5/2007 | Lu | WO | 2004087985 | 10/2004 | |
| 2007/0109543 A1 | 5/2007 | Hoffman | WO | 2004089836 | 10/2004 | |
| 2007/0111012 A1 | 5/2007 | Rimmer | WO | 2004089838 | 10/2004 | |
| 2007/0116966 A1 | 5/2007 | Mellott | WO | 2004089839 | 10/2004 | |
| 2007/0116967 A1 | 5/2007 | Medwick | WO | 2004092088 | 10/2004 | |
| 2007/0129248 A1 | 6/2007 | Labrousse | WO | 2004092089 | 10/2004 | |
| 2007/0134501 A1 | 6/2007 | McMaster | WO | 2004097063 | 11/2004 | |
| 2007/0137673 A1 | 6/2007 | Boykin | WO | 2004108618 | 12/2004 | |
| 2007/0148064 A1 | 6/2007 | Labrousse | WO | 2004108619 | 12/2004 | |
| 2007/0184291 A1 | 8/2007 | Harris | WO | 2004108846 | 12/2004 | |
| 2007/0196563 A1 | 8/2007 | Wuwen | WO | 2004113064 | 12/2004 | |
| 2007/0218264 A1 | 9/2007 | Gueneau | WO | 2005000758 | 1/2005 | |
| 2007/0218265 A1 | 9/2007 | Harris | WO | 2005000759 | 1/2005 | |
| 2007/0218311 A1 | 9/2007 | O'Shaughnessy | WO | 2005005337 | 1/2005 | |
| 2007/0224357 A1 | 9/2007 | Buhay | WO | 2005007286 | 1/2005 | |
| 2007/0231501 A1 | 10/2007 | Finley | WO | 2005009914 | 2/2005 | |
| 2007/0237968 A1 | 10/2007 | Kijima | WO | 2005012593 | 2/2005 | |
| 2007/0254163 A1 | 11/2007 | Veerasamy | WO | 2005023723 | 3/2005 | |
| 2007/0254164 A1 | 11/2007 | Veerasamy | WO | 2005040056 | 5/2005 | |
| 2007/0275252 A1 | 11/2007 | Krasnov | WO | 2005102952 | 11/2005 | |
| 2007/0275253 A1 | 11/2007 | Thiel | WO | 2005110937 | 11/2005 | |
| 2008/0011408 A1 | 1/2008 | Maschwitz | WO | 2005111257 | 11/2005 | |
| 2008/0014349 A1 | 1/2008 | Otani | WO | 2006004169 | 1/2006 | |
| 2008/0026161 A1 | 1/2008 | Frings | WO | 2006007062 | 1/2006 | |
| 2008/0115471 A1 | 5/2008 | Labrousse | WO | 2006019995 | 2/2006 | |
| 2008/0119352 A1* | 5/2008 | Kitaguchi ............ 502/74 | WO | 2006020477 | 2/2006 | |
| 2008/0124460 A1* | 5/2008 | Athey et al. ............ 427/165 | WO | 2006028729 | 3/2006 | |
| 2008/0188370 A1 | 8/2008 | Vormberg | WO | 2006055513 | 5/2006 | |
| | | | WO | WO2006054954 | 5/2006 | |
| | FOREIGN PATENT DOCUMENTS | | WO | 2006057830 | 6/2006 | |
| | | | WO | 2006062902 | 6/2006 | |
| EP | 0574119 | 4/1993 | WO | 2006064059 | 6/2006 | |
| EP | 0345045 | 10/1993 | WO | 2006064060 | 6/2006 | |
| EP | 0901991 | 3/1999 | WO | 2006066101 | 6/2006 | |
| EP | 1066878 | 1/2001 | WO | 2006077839 | 7/2006 | |
| EP | 1074525 | 2/2001 | WO | 2006089964 | 8/2006 | |
| EP | 0816466 | 5/2006 | WO | 2006101994 | 9/2006 | |
| EP | 1506143 | 5/2006 | WO | 2006108985 | 10/2006 | |
| FR | 2738836 | 3/1997 | WO | 2006117345 | 11/2006 | |
| FR | 2884147 | 10/2006 | WO | 2006134335 | 12/2006 | |
| JP | 2000094569 | 4/2000 | WO | 2007016127 | 2/2007 | |
| JP | 2006305527 | 11/2006 | WO | 2007018974 | 2/2007 | |
| WO | 9707069 | 2/1997 | WO | 2007018975 | 2/2007 | |

| WO | 2007045805 | 4/2007 |
| WO | 2007080428 | 7/2007 |
| WO | 2007093823 | 8/2007 |
| WO | 2007096461 | 8/2007 |
| WO | WO2007092511 | 8/2007 |
| WO | 2007110482 | 10/2007 |
| WO | 2007121211 | 10/2007 |
| WO | 2007121215 | 10/2007 |
| WO | WO2007127060 | 11/2007 |
| WO | WO2007130140 | 11/2007 |

OTHER PUBLICATIONS

J.M. Bell et al., "Electrochromism in sol-gel deposited TiO2 films," Proceedings SPIE—The International Society for Optical Engineering, vol. 2255, Apr. 18-22, 1994.

T. Brat et al., "The Influence of Tungsten-10Wt% Titanium Sputtering Target Purity and Density on VLSI Applications," 2nd ASM International™ Electronic Materials and Processing Congress (Apr. 24-28, 1989, Philadelphia, PA).

J.R. Creighton, "Non-Selective Tungsten CVD Using Tungsten Hezxacarbonyl," Sandia National Laboratories, Albuquerque, NM, 1987.

N. de Tacconi et al., "Nanoporous TiO2 and WO3 Films by Anodization of Titanium and Tungsten Substrates: Influence of process Variables on Morphology and Photoelectrochemical Response," J. Phys. Chem B 2006, 110, pp. 25347-25355.

D. Diesburg et al., "Low Mobile Ion Contamination From Sputtered High Purity Tungsten," 12th International Plansee Seminar, 1973, 1989, pp. 371-378.

A. Enesca et al., "Novel Approach of TiO2/WO3 for Water Splitting," 20th European photovoltaic Solar Energy Conference, Jun. 6-10, 2005, pp. 262-265.

B. Gao et al., "Great Enhancement of Photocatalytic Activity of Nitrogen-Doped Titania by Coupling with Tungsten Ozxide," J. Phys. Chem B 2006, 110, pp. 14391-14397.

J. Göttsche et al., "Electrochromic mixed Wo3—TiO2 thin films produced by sputtering and the sol-gel technique: a comparison," Solar Energy Materials and Solar Cells 31 (1993) pp. 415-428.

M. Gusev et al., "Sputtering of tungsten, tungsten oxide, and tungsten—carbon mixed layers by deuterium ions in the threshold energy region," Tech Phys. 44 (9), Sep. 1999, pp. 1123-1127.

F. Hamelmann et al., "Metal oxide/silicon oxide multilayer with smooth interfaces produced by in situ controlled plasma-enhanced MOCVD," Thin Solid Films 358 (2000), pp. 90-93.

S. Hashimoto et al., "Lifetime of Electrochromism of AmorphousWO3—TiO2 thin Films," J. Electrochem. Soc., vol. 138, No. 8, Aug. 1991, pp. 2403-2408.

J. Herrera et al., "Synthesis, characterization, and catalytic function of novel highly dispersed tungsten oxide catalysts on mesoporous silica," J. Catalysis 239 (2006), pp. 200-211.

S. Higashimoto et al., "Photoelectrochemical properties of hybrid WO3TiO2 electrode. Effect of structures of WO3 on charge separation," Thin Solid Films 503 (2006), pp. 201-206.

A. Hodgson et al., "Photocatalytic Reactor Systems with Tungsten Oxide-Modified Titanium Dioxide for Indoor Air Applications," 11th Conference on TiO2 Photocatalysis: fundamentals & Applications (Sep. 25-28, 2006, Pittsburgh, PA).

H. Irie et al., "Interfacial structure dependence of layered TiO2/Wo3 thin films on the photoinduced hydrophilic property," Vacuum 74 (2004), pp. 625-629.

R. Jossen et al., "Thermal stability and catalytic activity of flame-made silica-vanadia-tungsten oxide-titania,", App. Catalysis B: Environmental 69 (2007), pp. 181-188.

O. Kanou, "Application of High Purity W for VLSI Sputtering Targets," 7th International Tungsten Symposium, Sep. 1996, pp. 410-418.

V. Keller et al., "Photocatalytic oxidation of butyl acetate in vapor phase on TiO2, Pt/TiO2 and WO3/TiO2 catalysts," Journal of Catalysis 215 (2003), pp. 129-138.

M. Kobayashi et al., "V2O5-WO3/TiO2-SiO2-SO42-catalysts: Influence of active components and supports on activities in the selective catalytic reduction of NO by NH3 and in the oxidation of SO2," Applied Catalysis B: Environmental 63 (2006), pp. 104-113.

C. Lo et al., "Influence of Target Structure on Film Stress in WTI Sputtering," Mat. Res. Soc. Symp. Proc. vol. 505, 1998, pp. 427-432.

M. Miyauchi et al., "A Highly Hydrophilic Thin Film Under 1 µW/cm2 UV Illumination," Adv. Mater. 2000, 12, pp. 1923-1927.

T. Obee et al., "A Kinetic Study of Photocatalytic Oxidation of VOCs on WO3 Coated Titanium Dioxide," 11th Conference on TiO2 Photocatalysis: fundamentals & Applications (Sep. 25-28, 2006, Pittsburgh, PA).

K. Okimura et al."Characteristics of rutile TiO2 films prepared by R.F. magnetron sputtering at a low temperature,". Thin Solid Films 281-282 (1996) pp. 427-430.

C. Ramana et al., "Structural Stability and Phase Transitions in WO3 Thin Films," J. Phys Chem B (2006), pp. 10430-10435.

T. Richardson et al., "Tungsten-Vanadium Oxide Sputtered Films for Electrochromic Devices," http://btech.lbl.gov/papers/42381.pdf.

I. Saeki et al., "The Photoelectrochemical Response of TiO2—Wo3 Mixed Oxide Films Prepared by Thermal Oxidation of Titanium Coated with Tungsten," J. Electrochem. Soc., vol. 143, No. 7, Jul. 1996, pp. 2226-2229.

S. Schiller et al., "Influence of Deposition Parameters on the Optical and Structural Properties of TiO2 Films Produced by Reactive D.C. Plasmetron Sputtering," Thin Solid Films 83 (1981), pp. 239-245.

International Search Report and Written Opinion, dated Sep. 1, 2009 for PCT Application No. PCT/US2008/076183, 10 pages.

English-language abstract for WO01/68786.

English-language abstract for WO2006/077839.

English-language abstract for FR2884147.

International Search Report and Written Opinion, dated Apr. 17, 2009 for PCT Application No. PCT/US2008/076157, 18 pages.

English-language abstract for FR 2738836.

English-language abstract for JP 2006305527.

English-language abstract for WO 2005102952.

English-language abstract for JP 2000094569.

A. Schintlmeister et al., "Optical Coatings (nb2O5, Ta2O5 and WO3) for LAC-applications Obtained by DC Quaslreactive magnetron Sputtering of Ceramic Sputtering Targets," 46th Annual Technical Conference Proceedings—Soc. Of Vacuum Coaters, May 3-8, 2003, pp. 296-301.

K. Schwarz et al., Thermal material spraying—an alternative technique for the production of special purpose sputtering targets—abstract.

Y. Shen et al., "A new method to prepare tungsten and nitrogen co-doped titanium dioxide and its excellent photocatalytic activities irradiated by visible light," 11th Conference on TiO2 Photocatalysis: fundamentals & Applications (Sep. 25-28, 2006, Pittsburgh, PA).

I. Shiyanovskaya et al., "Biocomponent WO3/TiO2 Films as Photoelectrodes," J. Electrochemical Soc. 146 (1999), pp. 243-249.

V.S. Sinel'nikova et al., "Interaction of a Mixture of Oxides of Tungsten and Silicon With Carbon," Soviet Powder Metallurgy and Metal Ceramics, vol. 29, No. 3(327), Mar. 1990, pp. 234-236.

H. Song et al., "Efficient degradation of organic pollutant with Wox modified nano TiO2 under visible irradiation," J. of Photochemistry and Photobiology A: Chemistry 181 (2006), pp. 421-428.

R. Staffler et al, "Advanced Coating Technology Based Upon Sputtering Targets Produced by Powder Metallurgy," Horizons of Powder Metallurgy Part I, Proceedings of the 1986 International Powder Metallurgy Conference and Exhibition, Jul. 7-11, 1986, pp. 219-222.

N.E. Stankova et al., "Thin (0 0 1) tungsten trioxide films grown by laser deposition," App. Surface Science 247 (2005), pp. 401-405.

H. Stumpp et al, "Manufacturing of Superclean Refractory and Reactive Metals and Alloys in High Vacuum for Advanced Technologies," 8th ICVM: Special Melting/Refining and Metallurgical Coating Under Vacuum or Controlled Atmosphere, vol. 2, Sep. 1985, pp. 1310-1324.

L. Su et al., "All Solid-State Smart Window of Electrodeposited WO3 and TiO2 Particulate Film With PTREFG Gel Electrolyte," J. Phys Chem Solids, vol. 59, No. 8, 1998, pp. 1175-1180.

J. Szczyrbowski et al., "Properties of TiO2—Layers Prepared by Medium Frequency and DC Reactive Sputtering," 1997 Soc. Of Vacuum Coaters (1997), pp. 237-241.

H. Tada et al., "Deactivation of the TiO2 Photocatalyst by Coupling with WO3 and the Electrochemically Assisted High Photocatalytic Activity of WO3," Langmuir 20 (2004), pp. 4665-4670.

I. Wachs et al., "Catalysis science of the solid acidity of model supported tungsten oxide catalysts," Catalysis Today 116 (2006), pp. 162-168.

P. Wilhartitz et al., "3D-SIMS analysis of ultra high purity molybdenum and tungsten: a characterisation of different manufacturing techniques," Fresenius J Anal chem. (1995) 353: pp. 524-532.

N. Yamamoto et al., "Characteristics of Tungsten Gate Devices for MOS VLSI's," Materials Research Society, 1986, pp. 297-311.

N. Yamamoto et al., "Fabrication of Highly Reliable Tungsten Gate MOS VLSI's," J. Electrochem. Soc., vol. 133, No. 2, Feb. 1986, pp. 401-407.

M. Yamauchi et al., "Development of W-Ti Binary Alloy Sputtering Target and Study of its sputtering Characteristics," Nippon Tungsten Review, vol. 22 (1989), pp. 55-72.

D. Yoo et al., "Effects of annealing temperature and method on structural and optical properties of TiO2 films prepared by RF magnetron sputtering at room temperature," App. Surface Science 253 (2007), pp. 3888-3892.

J.K. Yoon et al., "Growth kinetics and oxidation behavior of WSi2 coating formed by chemical vapor deposition of Si on W substrate," J. Alloys and Compounds 420 (2006), pp. 199-206.

W. Zanhai et al., "Preparation of W-Ti Sputtering Targets under Inert Atmosphere," Chinese Journal of Rare Metals, vol. 30, No. 5, 2006, Abstract.

W. Zanhai et al., "Tungsten-Titanium Targets and Manufacturing Technology," Chinese Journal of Rare Metals, vol. 30, No. 1, 2006, Abstract.

P. Zemen et al., "Self-cleaning and antifogging effects of TiO2 films prepared by radio frequency magnetron sputtering," J. Vac. Sci. Technol. A, Mar./Apr. 2002, pp. 388-393.

* cited by examiner

LOW-MAINTENANCE COATING TECHNOLOGY

CROSS-REFERENCE TO RELATED APPLICATIONS

The present application claims priority to U.S. Application No. 60/972,527, filed Sep. 14, 2007, and U.S. Application No. 61/039,760, filed Mar. 26, 2008, the entire disclosures of which are incorporated herein by reference.

FIELD OF THE INVENTION

The present invention provides thin film coatings for substrates. More particularly, the invention provides low-maintenance coatings for glass and other substrates. The invention also provides methods for producing low-maintenance products. Further, the invention provides sputtering targets and coaters.

BACKGROUND OF THE INVENTION

Low-maintenance coatings, for example photocatalytic coatings, are well known in the present art. A great deal of research has been done in attempting to develop low-maintenance coatings that exhibit good properties, such as self-cleaning properties and hydrophilicity.

Most conventional low-maintenance coatings include a layer of titanium dioxide (i.e., $TiO_2$). While many of these coatings are advantageous, there is room for improvement. For example, it would be desirable to provide thin low-maintenance coatings that have low visible reflection and good color neutrality, and yet can achieve significant photoactivity levels, hydrophilicity, and/or activation ability. It would be particularly desirable to provide coatings that achieve these properties while at the same time are durable, stable, and resistant to haze formation (e.g., during tempering or other heat treatments).

SUMMARY OF THE INVENTION

A substrate having a major surface on which there is a low-maintenance coating is provided, in accordance with certain embodiments. The low-maintenance coating provides photocatalytic and/or hydrophilic properties and is preferably has properties that are easily activated. The low-maintenance coating can include a thickness of film comprising titania, said thickness being less than 250 Å, wherein only part of that thickness includes tungsten oxide, said thickness including an inner portion and an outer portion, the inner portion being closer to the substrate than is the outer portion, the outer portion being the part that includes tungsten oxide. The low-maintenance coating can have a thickness of less than 300 Å. The thickness of the film comprising titania can be greater than about 50 Å. Likewise, the thickness of the outer portion can be no more than about 90 Å. The outer portion can also define an exposed, outermost face of the low-maintenance coating, the outer portion being a substantially homogenous film comprising both titanium dioxide and tungsten oxide. The outer portion can further comprise nitrogen. The inner portion can be a substantially homogenous film consisting essentially of titania. In some cases, the outer portion can have a tungsten load characterized by a metal-only atomic ratio of between about 0.01 and about 0.34, this ratio being the number of tungsten atoms in the outer portion divided by the number of titanium atoms in the outer portion.

The low maintenance coating can also include a base film, which can comprise silica or alumina in some embodiments. The base film can also have a thickness of less than about 100 Å. The low maintenance coating can also include an intermediate film provided on the base film, which can have a thickness of less than 100 Å in some embodiments. In certain cases, the base film comprises alumina and the intermediate film comprises silica, and the alumina base film and the intermediate silica film each have a thickness of less than about 50 Å. In one embodiment, the alumina base film has a thickness of about 40 Å, and the silica intermediate film has a thickness of about 30 Å. The low-maintenance coating can optionally be over a transparent conductive oxide film, which can have a thickness of less than about 10,000 Å. The substrate may, for example, be a transparent pane that is part of a multiple-pane insulating glazing unit having a between-pane space, wherein the major surface bearing the low-maintenance coating faces away from the between-pane space of the unit.

A method of producing a low-maintenance product is provided, in accordance with certain embodiments. The method can include depositing a low-maintenance coating on a major surface of a substrate, the low-maintenance coating including a thickness of film comprising titania, wherein only part of that thickness includes tungsten oxide, wherein the thickness of film comprising titania includes an inner portion and an outer portion, the outer portion being the part that includes tungsten oxide, the inner portion being deposited before the outer portion is deposited, and wherein the substrate is subjected to heating after the inner portion has been deposited but before the outer portion is deposited. The substrate can also be subjected to heating before the inner portion has been deposited or even during deposition of either the inner portion and outer portion. In addition, the low-maintenance coating can be deposited in a sputter coater, wherein said heating is performed inside the coater, and wherein said heating brings the substrate to a maximum temperature of greater than 140° F. but less than 350° F. In some cases, the heating is performed inside of a deposition chamber that is adapted for depositing the inner portion, the heating taking place after the inner portion is deposited. In other cases, the heating is performed inside of a deposition chamber that is adapted for depositing the outer portion, the heating taking place before the outer portion is deposited. In yet other cases, the heating is performed inside of a heating chamber that is adapted for depositing the inner portion and a second deposition chamber that is adapted for depositing the outer portion. The method can also include conveying the substrate through one or more inter-stage sections that are part of a coater, the inter-stage sections being adapted for maintaining the substrate at a temperature of at least 160° F. In some cases, at least one of the inter-stage sections is positioned between a first deposition chamber adapted for depositing the inner portion and a second deposition chamber that is adapted for depositing the outer section.

Another method of producing a low-maintenance product is provided, in accordance with other embodiments. The method can include providing a substrate having a major surface on which there is a low-maintenance coating, the low-maintenance coating including a thickness of film comprising titania, said thickness being greater than about 50 Å but less than 250 Å, wherein only part of that thickness includes tungsten oxide, said thickness including an inner portion and an outer portion, the inner portion being closer to the substrate than is the outer portion, the outer portion being the part that includes tungsten oxide, the method further comprising heat treating said coated substrate to bring it to a temperature of at least about 160° F. In some cases, the heat treating is accomplished by positioning the coated substrate in a heating chamber for at least 60 seconds during which time the heating chamber is maintained at a temperature of at least 650° C. In other cases, the heat treating is accomplished by heat treating the coated substrate inside of a deposition chamber that is adapted for depositing either the inner portion or the outer portion. The heat treating can include heating during deposition and/or before deposition and/or after deposition. The method can further include cooling the coated substrate back down to room temperature, at which point the coated substrate exhibits a haze of less than about 0.4. This cooling can be performed on substrates wherein the thickness of the outer portion is no more than about 90 Å.

A sputtering technique for depositing a low-maintenance coating over a major surface of a substrate is also provided, in accordance with certain embodiments. The sputtering technique can include depositing a thickness of film comprising titania, wherein at least part of that thickness includes tungsten oxide and is deposited by sputtering one or more targets having a sputterable material comprising both titania and tungsten oxide, wherein the sputterable material includes: i) tungsten in oxide form, ii) TiO, and iii) $TiO_2$. In some cases, substantially all the tungsten in the sputterable material is in oxide form. The depositing can also be accomplished by sputtering the targets in an atmosphere comprising argon and oxygen. The depositing can also be accomplished by sputtering the targets in an atmosphere comprising argon, oxygen, and nitrogen. In some cases, the sputterable material is characterized by a metal-only atomic ratio of between about 0.01 and about 0.34, this ratio being the number of tungsten atoms in the sputterable material divided by the number of titanium atoms in the sputterable material. The thickness of film comprising titania being deposited can include an inner portion and an outer portion, the inner portion being closer to the substrate than is the outer portion, wherein only the outer portion includes tungsten oxide, the outer portion being deposited as a substantially homogenous film comprising titanium oxide and tungsten oxide. The inner portion can also be deposited as film consisting essentially of titania. The thickness of the film comprising titania can also be less than 250 Å.

A sputtering target is also provided, in accordance with certain embodiments. The target can have a sputterable material comprising both titania and tungsten oxide, wherein the sputterable material includes: i) tungsten in oxide form, ii) TiO, and iii) $TiO_2$. In some cases, substantially all the tungsten in the sputterable material is in oxide form. In certain cases, the sputterable material consists essentially of: i) tungsten in oxide form, ii) TiO, and iii) $TiO_2$. The sputterable material can also have a metal-only atomic ratio between about 0.01 and about 0.34, this ratio being the number of tungsten atoms in the sputterable material divided by the number of titanium atoms in the sputterable material. The target can be a cylindrical rotary target, the sputterable material being carried on an exterior wall of an elongated backing tube, the elongated backing tube having a length of at least 24 inches, the target being adapted to rotate about a central axis to which the exterior wall of the backing tube is substantially parallel.

A sputter coater is also provided, in accordance with certain embodiments. The sputter coater can include two or more chambers that include sputtering chambers and/or heating chambers. The coater can also include at least one inter-stage section connecting the two or more chambers. For example, the inter-stage section can connect two sputtering chambers or a heating chamber and a sputtering chamber. The inter-stage section can also have an interior space that is surrounded by alternating layers of a conductive metal and a ceramic material. At least one heating source can be provided that applies heat to the inter-stage section, so that the interior space is maintained at a temperature of at least 160° F. In some cases, the coater is adapted for depositing a thickness of film comprising titania, wherein only a part of that thickness includes tungsten oxide, the thickness including an inner portion and an outer portion, the inner portion being closer to the substrate than the outer portion, the outer portion being the part that includes tungsten oxide. In these cases, the inter-stage section can connect a first sputtering chamber that is adapted for depositing the inner portion and a second sputtering chamber that is adapted for depositing the outer portion. The inter-stage section can also connect a heating chamber and a sputtering chamber that is adapted for depositing the outer portion.

In certain embodiments, the invention provides a substrate having a major surface on which the following films are coated in sequence, moving outwardly from the major surface: (1) a functional film comprising a material selected from the group consisting of indium tin oxide and fluorine-containing tin oxide; and (2) a thickness of film comprising titania. Only part of that thickness includes tungsten oxide. The thickness of film comprising titania includes an inner portion and an outer portion. The inner portion is closer to the substrate than is the outer portion. And the outer portion is the part that includes tungsten oxide. In the present embodiments, a thickness ratio defined as the thickness of film comprising titania divided by the thickness of the functional film can optionally be between about 0.004 and about 0.08.

Some embodiments provide a substrate having a major surface on which there is both a transparent conductive oxide film and a low-maintenance coating. The transparent conductive oxide film is closer to the substrate than is the low-maintenance coating. The low-maintenance coating includes a thickness of film comprising titania, and only part of that thickness includes tungsten oxide. The thickness of film comprising titania includes an inner portion and an outer portion. The inner portion is closer to the substrate than is the outer portion. The outer portion is the part that includes tungsten oxide. Between the transparent conductive oxide film and the thickness of film comprising titania, there can optionally be two layers including one comprising silica and one comprising alumina.

DETAILED DESCRIPTION OF PREFERRED EMBODIMENTS

Figure 1:
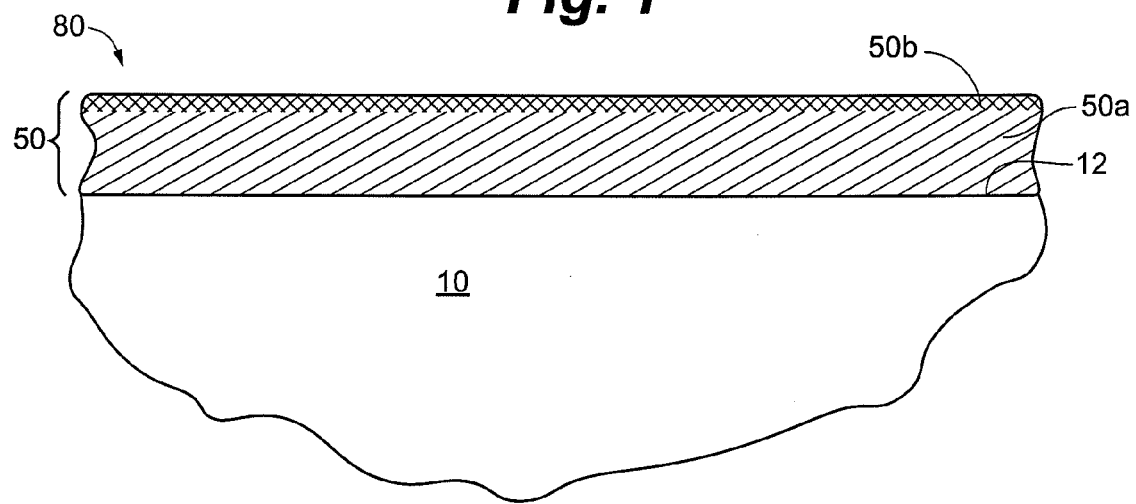
FIG. 1 is a schematic cross-sectional view of a substrate having a major surface carrying a low-maintenance coating in accordance with certain embodiments.

The following detailed description is to be read with reference to the drawings, in which like elements in different drawings have like reference numbers. The drawings, which are not necessarily to scale, depict selected embodiments and are not intended to limit the scope of the invention. Skilled artisans will recognize that the given examples have many alternatives that fall within the scope of the invention.

Many embodiments of the invention involve a coated substrate. A wide variety of substrate types are suitable for use in the invention. In some embodiments, the substrate 10 is a sheet-like substrate having generally opposed first 12 and second 14 major surfaces. For example, the substrate can be a sheet of transparent material (i.e., a transparent sheet). The substrate, however, is not required to be a sheet, nor is it required to be transparent.

The substrate can optionally be a component of any of a variety of building materials. Examples of anticipated applications include embodiments wherein the substrate is a sash (e.g., a window sash or a door sash), a siding panel (e.g., an aluminum siding panel), a tent panel, a tarpaulin (e.g., a fluorocarbon polymer tarpaulin), a plastic film (e.g., a fluorocarbon plastic film), a roofing shingle, a window blind (such as a metal, plastic, or paper window blind), a paper screen (e.g., a shoji), a railing, a baluster, or an escutcheon. In one embodiment, the substrate is a ceramic tile, such as a wall, ceiling, or floor tile. In another embodiment, the substrate is a glass block. A variety of suitable glass blocks can be obtained commercially from Saint-Gobain Oberland (Koblenz, Germany). In still other embodiments, the substrate is a polyester film, a polyethylene film, a terephthalate film, etc. Suitable films of this nature can be obtained commercially from Nippon Soda Co., Ltd. (Tokyo, Japan). In further embodiments, the substrate is a fence or wall, such as a noise-reduction fence or wall. The substrate can alternatively be part of a photovoltaic device (e.g., it can be a cover for a photovoltaic device).

For many applications, the substrate will comprise a transparent (or at least translucent) material, such as glass or clear plastic. For example, the substrate is a glass sheet (e.g., a window pane) in certain embodiments. A variety of known glass types can be used, and soda-lime glass will commonly be preferred. In certain preferred embodiments, the substrate is part of a window, skylight, door, shower door, or other glazing. In some cases, the substrate is part of an automobile windshield, an automobile side window, an exterior or interior rear-view mirror, a bumper, a hubcap, a windshield wiper, or an automobile hood panel, side panel, trunk panel, or roof panel. In other embodiments, the substrate is a piece of aquarium glass, a plastic aquarium window, or a piece of greenhouse glass. In a further embodiment, the substrate is a refrigerator panel, such as part of a refrigerator door or window. In another embodiment, the substrate is part of an electrochromic device.

Substrates of various sizes can be used in the present invention. Commonly, large-area substrates are used. Certain embodiments involve a substrate 10 having a major dimension (e.g., a length or width) of at least about 0.5 meter, preferably at least about 1 meter, perhaps more preferably at least about 1.5 meters (e.g., between about 2 meters and about 4 meters), and in some cases at least about 3 meters. In some embodiments, the substrate is a jumbo glass sheet having a length and/or width that is between about 3 meters and about 10 meters, e.g., a glass sheet having a width of about 3.5 meters and a length of about 6.5 meters. Substrates having a length and/or width of greater than about 10 meters are also anticipated.

In some embodiments, the substrate 10 is a generally square or rectangular glass sheet. The substrate in these embodiments can have any of the dimensions described in the preceding paragraph and/or in the following paragraph. In one particular embodiment, the substrate is a generally rectangular glass sheet having a width of between about 3 meters and about 5 meters, such as about 3.5 meters, and a length of between about 6 meters and about 10 meters, such as about 6.5 meters.

Substrates of various thicknesses can be used in the present invention. In some embodiments, the substrate 10 (which can optionally be a glass sheet) has a thickness of about 1-5 mm. Certain embodiments involve a substrate 10 with a thickness of between about 2.3 mm and about 4.8 mm, and perhaps more preferably between about 2.5 mm and about 4.8 mm. In one particular embodiment, a sheet of glass (e.g., soda-lime glass) with a thickness of about 3 mm is used. In one group of embodiments, the thickness of the substrate is between about 4 mm and about 20 mm. Thicknesses in this range, for example, may be useful for aquarium tanks (in which case, the substrate can optionally be glass or acrylic). When the substrate is float glass, it will commonly have a thickness of between about 4 mm and about 19 mm. In another group of embodiments, the substrate is a thin sheet having a thickness of between about 0.35 mm and about 1.9 mm. Embodiments of this nature can optionally involve the substrate 10 being a sheet of display glass or the like.

Figure 3:
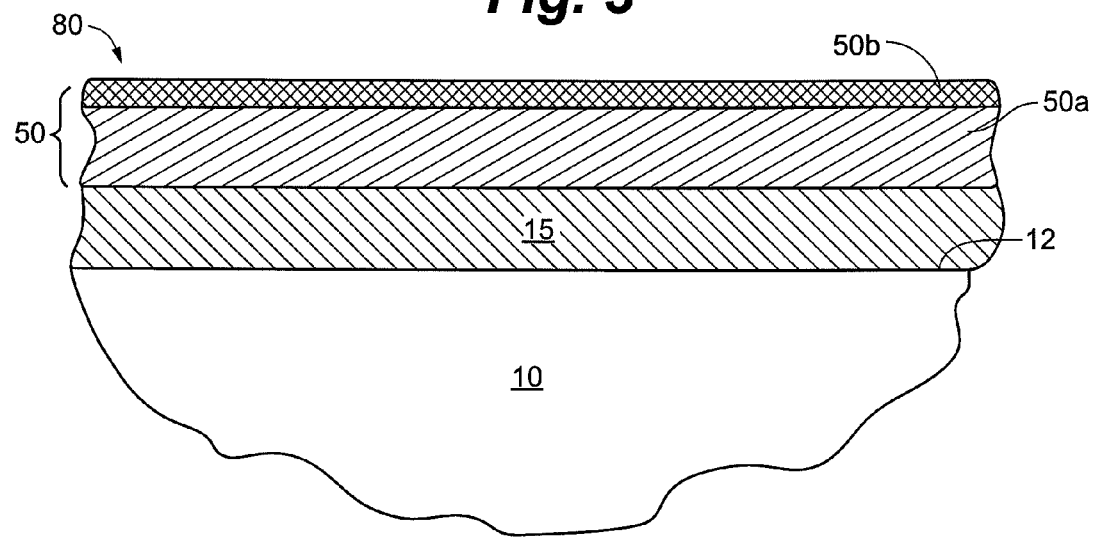
FIG. 3 is a schematic cross-sectional view of a substrate having a major surface carrying a low-maintenance coating in accordance with certain embodiments.

With reference to FIG. 1, there is shown a substrate 10 with a major surface 12 bearing a low-maintenance coating 80. The low-maintenance coating 80 preferably has photocatalytic properties, hydrophilic properties, or both. The low-maintenance coating 80 includes a thickness of film comprising titania 50. The film 50 includes an inner portion 50a and an outer portion 50b. The inner portion 50a is closer to the substrate than is the outer portion 50b. In come cases, there may be a discrete interface between the inner 50a and outer 50b portions of the film comprising titania, as shown in FIG. 3. For example, the inner 50a and outer 50b portions may be separate layers having a relatively well-defined interface. This may be the case, for example, when two such layers are initially deposited by sputtering. Alternatively, these two portions 50a, 50b may be graded into each other, or their interface may be otherwise blurred.

In some embodiments, the outer portion 50b defines an exposed, outermost face of the low-maintenance coating. The outer portion 50b comprises both titanium (e.g., titania) and tungsten (e.g., tungsten oxide). In some cases, the outer portion comprises titania and tungsten oxide. In certain cases, substantially all (or all) of the tungsten in the outer portion 50b is in oxide form. Preferably, the outer portion 50b contains more titania than tungsten oxide. In some embodiments, the outer portion 50b has between about 1-6 atomic percent tungsten, such as about 2.0-2.5 atomic percent (on a metal only basis). The outer portion 50b can optionally be a substantially homogenous film comprising both titania (e.g., $TiO_2$) and tungsten oxide. If desired, the outer portion 50b can consist essentially of titania and tungsten oxide. This, however, is not strictly required.

The inventors have found that adding tungsten oxide to a film comprising titania can increase photoactivity and hydrophilicity. However, a thick film of titania and tungsten oxide may be limited in terms of haze resistance, durability, and stability. Surprisingly, the inventors have discovered that incorporating tungsten oxide into a limited outer portion of a titania film can provide good photoactivity and hydrophilicity while at the same time achieving good haze resistance, durability, and stability.

The film comprising titania 50 can include $TiO_2$, TiO, or both. Other forms of titanium oxide, such as $TiO_x$, may also be present. In certain embodiments, the film 50 includes titania and an additional material, e.g., a material selected from the group consisting of nitrogen, tantalum, copper, silica, palladium, tin, niobium, and molybdenum. Other "additional materials" can also be used. The additional material may, for example, be a dopant that is present in an amount of up to five atomic percent, e.g., about two atomic percent or less. Larger concentrations may be preferred in other cases. The additional material, when provided, can be present throughout the inner portion 50a, the outer portion 50b, or both. It may be preferred, though, for the outer portion 50b to consist essentially of titania and tungsten oxide. It may also be preferred for the inner portion 50a to consist essentially of titania.

In some cases, the film 50 includes nitrogen. When provided, the nitrogen preferably is present in an amount of up to 10 percent or less, and more preferably 5% or less. When provided, the nitrogen may be present only in the inner portion 50a, only in the outer portion 50b, or in both the inner portion 50a and outer portion 50b.

The inner portion 50a can be a substantially homogenous film, a graded film, or some other type of non-homogenous film. In certain embodiments, the inner portion 50a is a substantially homogenous film comprising (optionally consisting essentially of) titania. In other embodiments, the inner portion 50a is a substantially homogenous film comprising (optionally consisting essentially of) titania and an additional material (such as one of the additional materials noted above).

The outer portion 50b can also be a substantially homogenous film, a graded film, or some other type of non-homogenous film. In certain embodiments, the outer portion 50b is a substantially homogenous film comprising (optionally consisting essentially of) titania and tungsten oxide. In other embodiments, the outer portion 50b is a substantially homogenous film comprising (optionally consisting essentially of) titania, tungsten oxide, and an additional material (such as one of those noted above).

In one group of embodiments, both the inner portion 50a and the outer portion 50b are substantially homogenous films. For example, the inner portion 50a can be a substantially homogenous film consisting essentially of titania, and the outer portion 50b can be a substantially homogenous film consisting essentially of titania and tungsten oxide. This, however, is by no means required.

In certain embodiments, the inner portion 50a has a thickness of between about 15 Å and about 100 Å, such as between about 15 Å and about 30 Å. In certain cases, the inner portion 50a has a thickness of about 25 Å. In other embodiments, though, the thickness of the inner portion 50a can be varied considerably outside these ranges to accommodate the requirements of different applications.

In connection with the outer portion 50b, the inventors have discovered that when the thickness of this portion is less than about 100 Å, preferably less than about 90 Å, and perhaps optimally less than about 75 Å (or even less than about 50 Å), the coating 80 can achieve an exceptional degree of haze resistance. For example, the haze of a glass pane carrying the present low-maintenance coating 80 can be less than 0.40 after tempering, or even less than 0.30, such as between about 0.2 and about 0.27. In preferred embodiments, the outer portion 50b has a thickness of between about 15 Å and about 100 Å, such as between about 20 Å and about 90 Å, e.g., between about 30 Å and about 75 Å. In certain embodiments, the outer portion 50b has a thickness of about 45 Å. Here again, the thickness can be chosen to be well outside these ranges to meet the requirements of different applications.

The total thickness of the film comprising titania 50 (including both the inner portion 50a and the outer portion 50b) preferably is less than 250 Å, more preferably less than 200 Å, perhaps less than 150 Å, or even less than 100 Å. The inventors have found that these thickness ranges are particularly advantageous in minimizing, or even eliminating, the color that can occur with thicker films of this particular nature. In other embodiments, though, thicker films may be used for applications where more color is desirable, or at least acceptable, or where another coating or pane neutralizes the color adequately.

The inventors have also discovered that if the thickness of the film comprising titania 50 is greater than about 50 Å, then there is a surprising boost in photoactivity, hydrophilicity, or both when the coated substrate is tempered or otherwise heat treated appropriately. When this thickness is less than about 50 Å, however, tempering does not appear to provide such a boost. Thicknesses of about 70 Å or greater are preferred in this regard. The mechanism behind this surprising boost in properties has not been definitively explained. It is surmised, however, that when the coated substrate is heat-treated, this causes a decrease in density of defect states of the film allowing the photoexcited electrons in the conduction band of the titania to have a longer lifetime resulting in an increase in quantum efficiency. The improved quantum efficiency results in more electron-hole pairs to generate hydroxyl radicals (OH.) and superoxide ions ($O_2^-$) to decompose and mineralize organic compounds by participating in a series of oxidation reactions. This results in a favorable change in photoactivity, hydrophilicity, or both. The inventors, though, do not wish to be bound by this explanation.

In one group of embodiments, the low-maintenance coating 80 has a "region ratio" of between 0.2 and 7. The term "region ratio" is defined as the thickness of the outer portion 50b divided by the thickness of the inner portion 50a. In some cases, the outer portion 50b is thinner than the inner portion 50a. This may be preferred when haze resistance is a primary concern. In other cases, though, the outer portion 50b is thicker than the inner portion 50a. This may be preferred for maximizing the photoactivity and hydrophilicity. Table 1 below depicts one exemplary embodiment of this nature.

In certain embodiments, the outer portion 50b has a tungsten load characterized by a metal-only atomic ratio of between about 0.001 and 0.4, such as between about 0.01 and about 0.34. This ratio is the number of tungsten atoms in the outer part 50b divided by the number of titanium atoms in the outer part. In one example, the outer portion 50b is deposited by reactively sputtering one or more ceramic targets each having about 91 atomic % titanium and about 9 atomic % tungsten (on a metal-only basis). In the resulting oxide film, the relative amount of tungsten may be slightly higher than in the target. For example, the oxide film may have about 89 atomic % titanium and about 11 atomic % tungsten (again, on a metal-only basis), in which case the specified metal-only atomic ratio is about 0.12. In another example, the resulting outer portion 50b is an oxide film having 97.5 atomic % titanium and about 2.5 atomic % tungsten, in which case the specified metal-only atomic ratio is about 0.26%. It is to be appreciated that the outer portion 50b may be an oxide film, an oxynitride film, etc.

Figure 2:
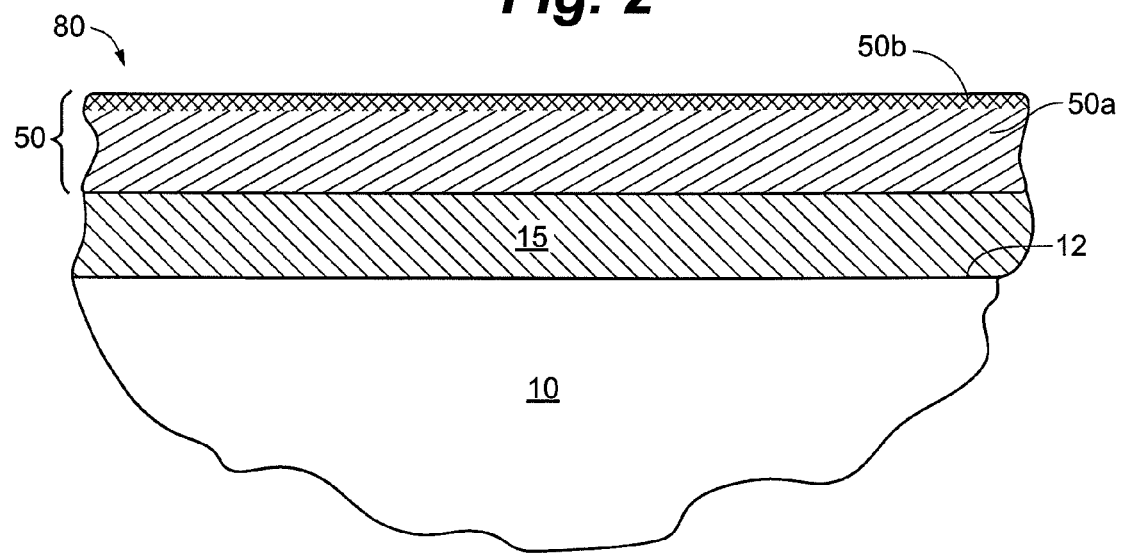
FIG. 2 is a schematic cross-sectional view of a substrate having a major surface carrying a low-maintenance coating in accordance with certain embodiments.

With reference to FIG. 2, in some embodiments, the low-maintenance coating 80 includes a base film 15 between the film 50 comprising titania and the substrate 10. The base film 15 can be any suitable material that adheres well to the substrate and/or protects the film 50 from sodium ion diffusion. In cases where the base film 15 is omitted, the substrate 10 itself can be treated to reduce or perhaps deplete the surface area of the substrate of sodium ions. The base film 15 can comprise a dielectric film in some embodiments. In certain embodiments, the base film comprises silica, alumina, or both. Thus, the base film 15 can optionally be a mixed film including two or more materials. In some cases, it is a mixed film comprising silica and alumina, or silica and titania, or silica, alumina and titania. Other materials can be used as well. In certain embodiments, the base film consists essentially of silica, or consists essentially of alumina. The base film 15 can also be a substantially homogenous film or a graded film. When provided, the base film 15 may be deposited directly onto the substrate, with the film comprising titania 50 being deposited directly onto the base film 15. This, however, is by no means required. When provided, the base film 15 can optionally have a thickness of less than about 300 Å. In certain embodiments, the base film 15 has a thickness of less than 120 Å or even less than 100 Å. In some embodiments, the base film 15 has a thickness of less than 50 Å, such as about 30 Å.

In certain embodiments, the base film 15 comprises both silica and alumina. For example the film can have a thickness (e.g., of about 70 Å), wherein the entire thickness comprises a mixed film (or a graded film) comprising silica and alumina. The mixed film can be formed by sputtering an alloy target that includes silicon and aluminum, for example about 50% silicon and about 50% aluminum, or about 25% silicon and about 75% aluminum, about 75% silicon and about 25% aluminum, or about 85% silicon and about 15% aluminum. Such an alloy target can be sputtered in an oxidizing atmosphere. The mixed film can also be formed by co-sputtering two targets, wherein one target is a silicon target and the other target is an aluminum target. Such co-sputtering can be performed in an oxidizing atmosphere. In other embodiments, the base film 15 includes an inner layer and an outer layer, wherein the inner layer comprises one of silica or alumina and the outer layer comprises the other of silica or alumina. In some cases, the inner layer has a thickness of about 30 Å and the outer layer has a thickness of about 40 Å. In yet other cases, the inner layer has a thickness of about 40 Å and the outer layer has a thickness of about 30 Å. In further embodiments, both the inner layer and the outer layer each have a thickness of about 35 Å.

In other embodiments, the base film 15 comprises or consists essentially of alumina and has a thickness of less than about 120 Å, perhaps less than about 50 Å, such as about 30 Å. Such a base film can be deposited, for example, by sputtering one or more aluminum targets in an oxidizing atmosphere. Alumina is believed to be a good sodium ion diffusion barrier. And it may help improve performance of the coated substrate in certain testing (100% relative humidity testing).

Figure 4:
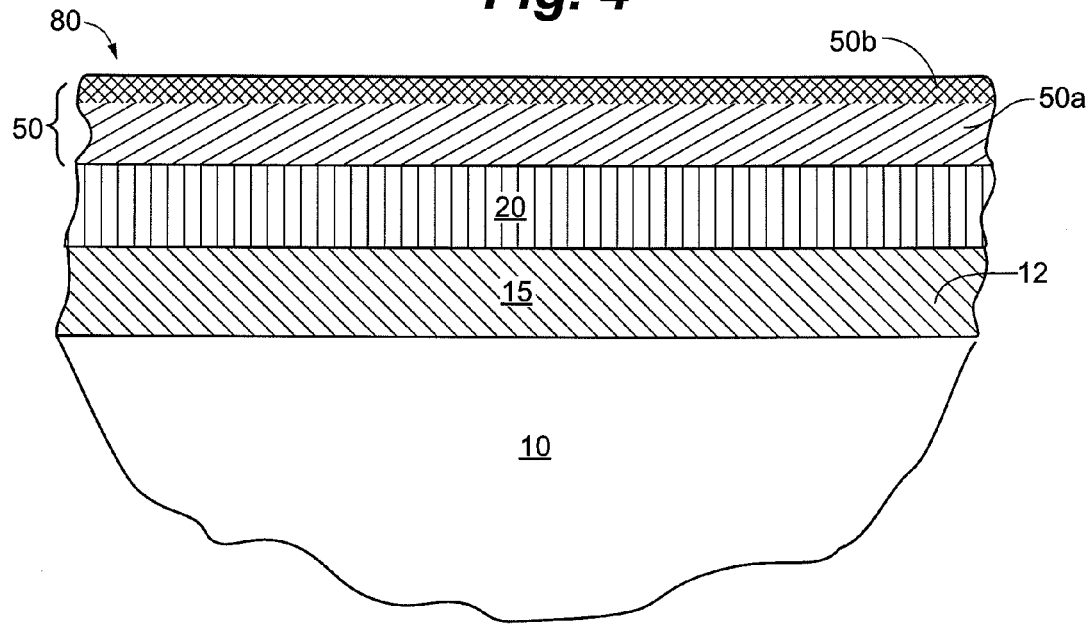
FIG. 4 is a schematic cross-sectional view of a substrate having a major surface carrying a low-maintenance coating in accordance with certain embodiments.
Figure 5:
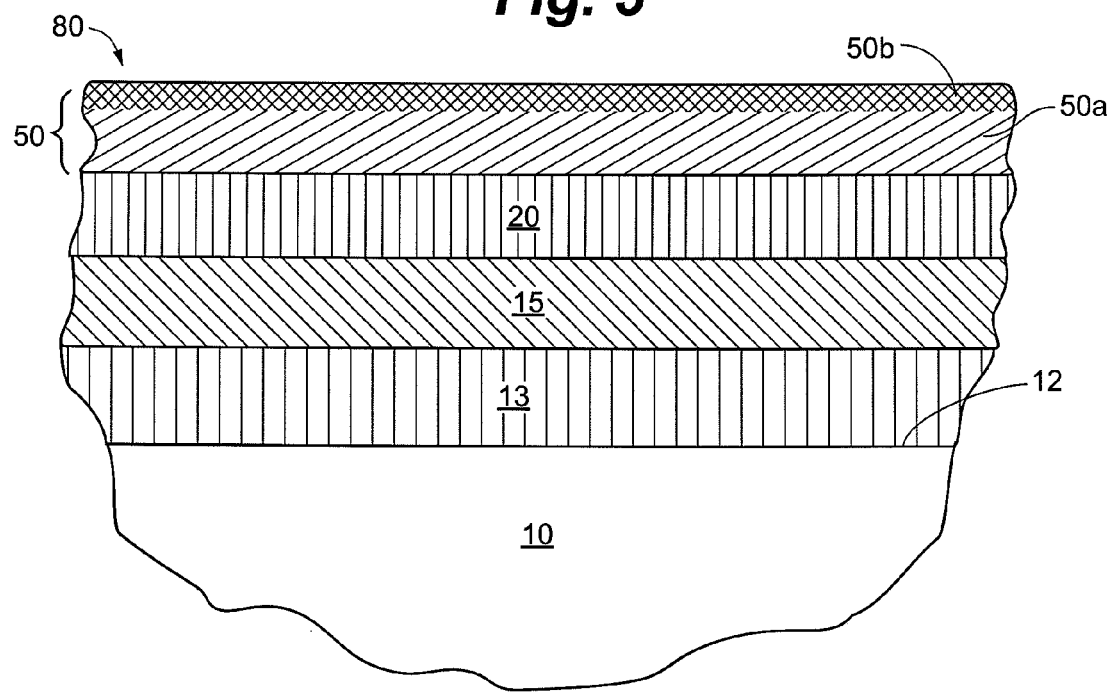
FIG. 5 is a schematic cross-sectional view of a substrate having a major surface carrying a low-maintenance coating in accordance with certain embodiments.

With reference to FIGS. 4 and 5, the low-maintenance coating 80 can optionally include one or more additional films 20 between the base film 15 and the film comprising titania 50. While a single intermediate film 20 is shown in FIGS. 4 and 5, multiple intermediate films can be provided, if so desired. When provided, such film(s) 20 can comprise any suitable material. With reference to FIG. 5, the low-maintenance coating 80 can optionally include a film 13 between the substrate 10 and the base film 15. In certain cases, the film 13 is provided in direct contact with the substrate 10 and base film 15. This, however, is not required. When provided, film 13 optionally be a semi-conductor film. In certain embodiments, film 13 comprises a transparent conductive oxide (TCO) film. Suitable TCO films include fluorine-doped tin oxide and indium tin oxide. In some embodiments, film 13 is provided at a thickness of 10,000 Å or less, such as about 3,000 Å. By providing a transparent conductive film 13 under the low-maintenance coating 80, the overall U value of a glazing incorporating the coated substrate can be lowered.

Table 1 below, for example, shows an embodiment where the low-maintenance coating 80 has a thicknesses of about 135 Å. It is to be appreciated, however, that the coating 80 can have much greater thicknesses, depending on the requirements of the intended application. Smaller thicknesses are also anticipated.

Following are a few exemplary coating embodiments of the invention.

TABLE 1

(Coating #1)

| Component | Material (comprising, consisting essentially of, or consisting of) | Thickness |
|---|---|---|
| Film 50 | Outer portion 50b: titania and tungsten oxide | 40-45 Å |
|  | Inner portion 50a: titania | 25 Å |
| Base Film 15 | Silica | 70 Å |
| Substrate | Glass | — |

TABLE 2

(Coating #2)

| Component | Material (comprising, consisting essentially of, or consisting of) | Thickness |
|---|---|---|
| Film 50 | Outer portion 50b: titania and tungsten oxide | 40-45 Å |
|  | Inner portion 50a: titania | 25 Å |
| Base Film 15 | Alumina | 70 Å |
| Substrate | Glass | — |

TABLE 3

(Coating #3)

| Component | Material (comprising, consisting essentially of, or consisting of) | Thickness |
|---|---|---|
| Film 50 | Outer portion 50b: titania and tungsten oxide | 40-45 Å |
|  | Inner portion 50a: titania | 25 Å |
| Intermediate Film 20 | Silica | 40 Å |
| Base Film 15 | Alumina | 30 Å |
| Substrate | Glass | — |

TABLE 4

(Coating #4)

| Component | Material (comprising, consisting essentially of, or consisting of) | Thickness |
|---|---|---|
| Film 50 | Outer portion 50b: titania and tungsten oxide | 40-45 Å |
|  | Inner portion 50a: titania | 25 Å |
| Intermediate Film 20 | Alumina | 40 Å |
| Base Film 15 | Silica | 30 Å |
| Substrate | Glass | — |

TABLE 5

(Coating #5)

| Component | Material (comprising, consisting essentially of, or consisting of) | Thickness |
|---|---|---|
| Film 50 | Outer portion 50b: titania and tungsten oxide | 40-45 Å |
|  | Inner portion 50a: titania oxide | 25 Å |
| Intermediate Film 20 | Silica | 40 Å |
| Base Film 15 | Alumina | 30 Å |
| Semi-Conductor Film 13 | Transparent Conductive Oxide | 3,000 Å |
| Substrate | Glass | — |

TABLE 5A (Coating #5A)

| Component | Material (comprising, consisting essentially of, or consisting of) | Thickness |
|---|---|---|
| Film 50 | Outer portion 50b: titania and tungsten oxide | 40-45 Å |
|  | Inner portion 50a: titania oxide | 25 Å |
| Intermediate Film 20 | Silica | 70 Å |
| Semi-Conductor Film 13 | Transparent Conductive Oxide | 3,000 Å |
| Barrier Layer | Silica | 500 Å |
| Substrate | Glass | — |

TABLE 5B (Coating #5B)

| Component | Material (comprising, consisting essentially of, or consisting of) | Thickness |
|---|---|---|
| Film 50 | Outer portion 50b: titania and tungsten oxide | 40-45 Å |
|  | Inner portion 50a: titania oxide | 25 Å |
| Intermediate Film 20 | Alumina | 70 Å |
| Semi-Conductor Film 13 | Transparent Conductive Oxide | 3,000 Å |
| Barrier Layer | Silica | 500 Å |
| Substrate | Glass | — |

In each of the exemplary coatings shown in the tables above, any silica film can optionally be doped with alumina.

Thus, certain embodiments provide a substrate with a major surface on which the following films are coated in sequence, moving outwardly from the major surface: (1) a functional film comprising a material selected from the group consisting of indium tin oxide, fluorine-containing tin oxide, and zinc aluminum oxide and (2) a thickness of film comprising titania, wherein only part of that thickness includes tungsten oxide. The thickness of film comprising titania includes an inner portion and an outer portion, and the inner portion is closer to the substrate than is the outer portion. The outer portion is the part that includes tungsten oxide. In some of the present embodiments, a thickness ratio defined as the thickness of film comprising titania divided by the thickness of the functional film is between about 0.004 and about 0.08, and perhaps more preferably between about 0.004 and about 0.025. In one example, film 50 has a thickness of about 70 Å and the functional film (e.g., a transparent conductive oxide layer thereof) has a thickness of about 3,000 Å, such that the noted thickness ratio is about 0.023. In another example, film 50 has a thickness of about 70 Å and the functional film (e.g., a transparent conductive oxide layer thereof) has a thickness of about 2,000 Å, such that the noted thickness ratio is about 0.035. In still another example, film 50 has a thickness of about 70 Å and the functional film (e.g., a transparent conductive oxide layer thereof) has a thickness of about 5,000 Å, such that the noted thickness ratio is about 0.014.

Figure 6:
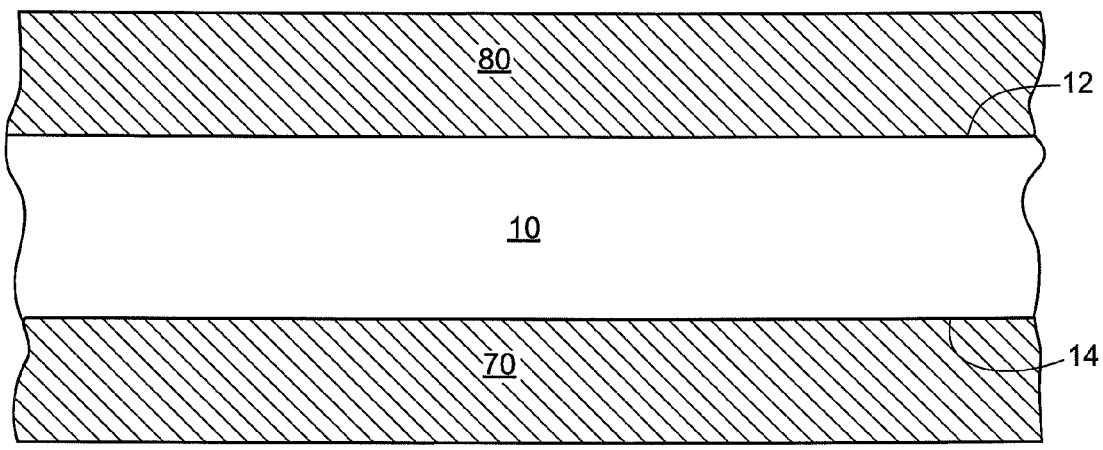
FIG. 6 is a schematic cross-sectional view of a substrate having one surface carrying a low-maintenance coating and another surface carrying an additional functional coating in accordance with another embodiment.

In some cases, the low-maintenance coating 80 is provided on one major surface of the substrate and another functional coating 70 is provided on an opposite major surface of the same substrate. FIG. 6 illustrates one such embodiment. Here, the substrate 10 has a first surface 12 bearing the low-maintenance coating 80 and a second surface 14 bearing another functional coating 70. Functional coating 70 can be a single layer or a stack of layers. Various functional coatings can be used. In some cases, the functional coating 70 is a low-emissivity coating. In some embodiments, the coating 70 includes three or more infrared-reflective layers (e.g., silver-containing layers). Low-emissivity coatings with three or more infrared-reflective layers are described in U.S. patent application Ser. Nos. 11/546,152, 11/545,323, 11/545,231, 11/545,212, 11/545,211, 11/398,345, and 11/360,266, the salient teachings of each of which are incorporated herein by reference. In other cases, the functional coating can be a "single silver" or "double silver" low-emissivity coating, which are well-known to skilled artisans. When provided, functional coating 70 can alternatively comprise a transparent conductive oxide (or "TCO") layer. Useful examples include fluorine-doped tin oxide, indium tin oxide, and zinc aluminum oxide to name just a few.

Figure 7:
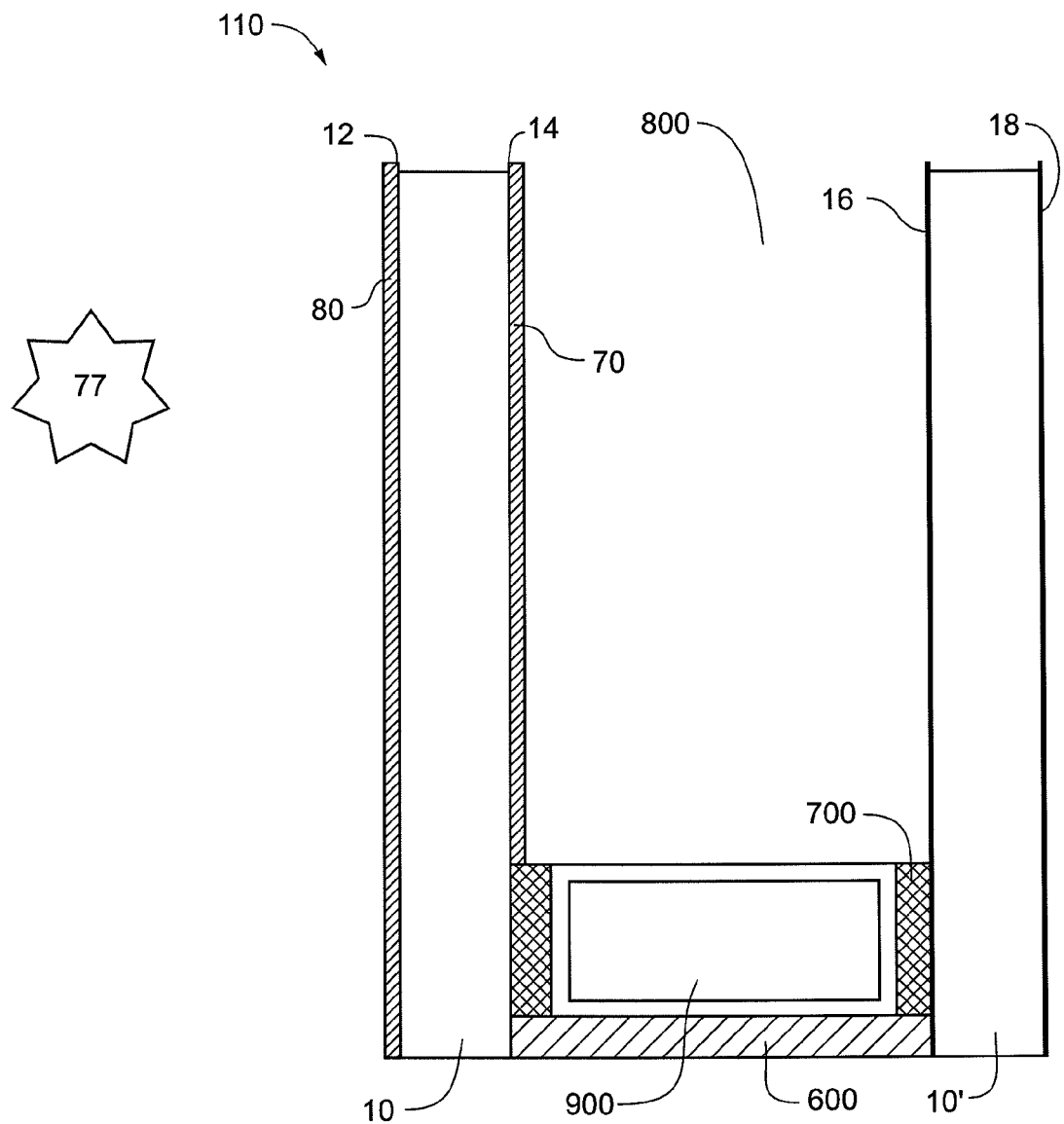
FIG. 7 is a partially broken-away schematic cross-sectional side view of a multiple-pane insulating glazing unit that includes an exterior pane having a first surface carrying a low-maintenance coating and a second surface carrying an additional functional coating in accordance with certain embodiments.
Figure 8:
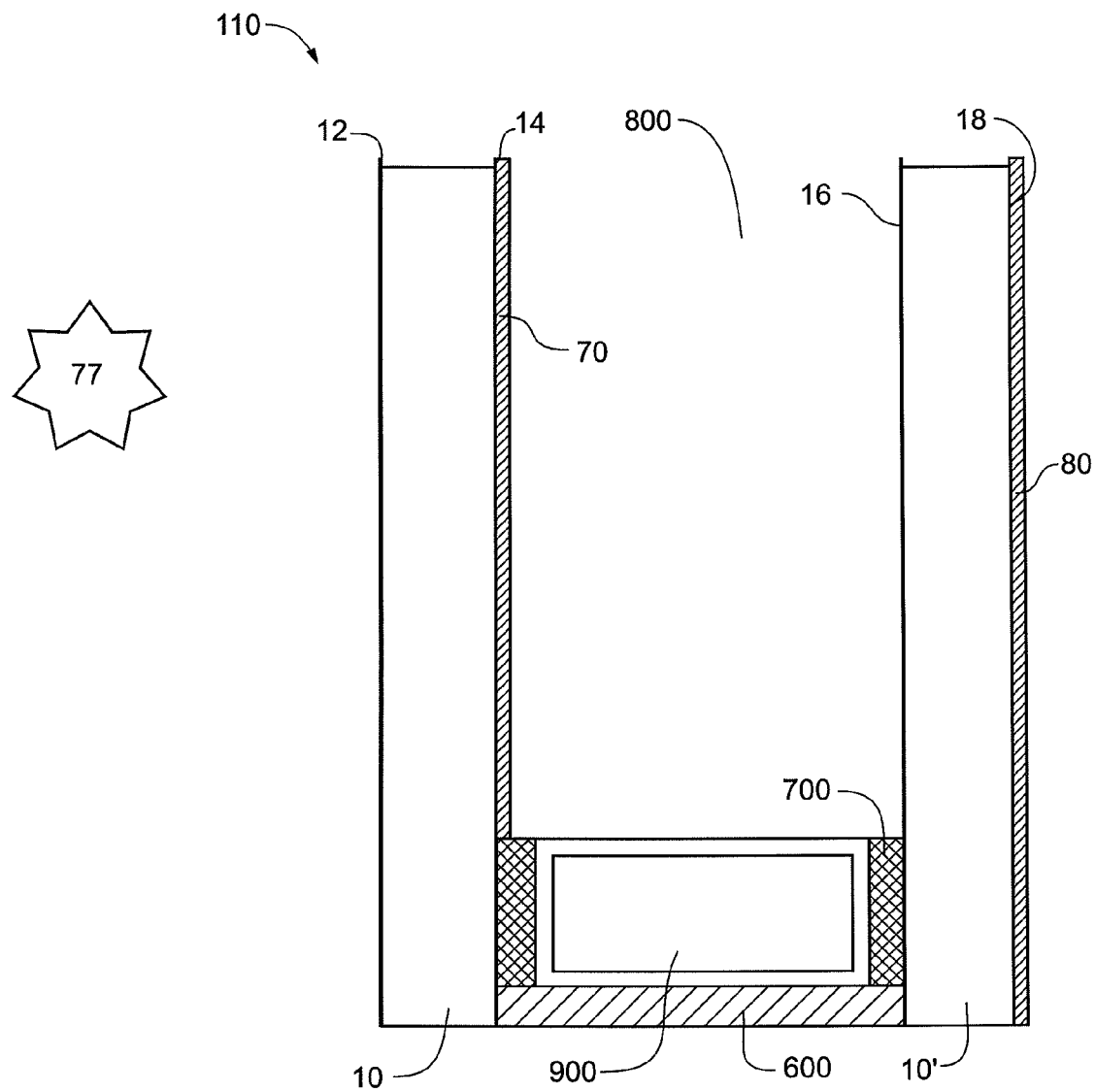
FIG. 8 is a partially broken-away schematic cross-sectional side view of a multiple-pane insulating glazing unit that includes an exterior pane having a second surface carrying a functional coating and an interior pane having a fourth surface carrying a low-maintenance coating in accordance with certain embodiments.

With reference to FIGS. 7 and 8, the substrate 10 can optionally be a transparent pane that is part of an insulating glazing unit 110. Typically, an insulating glazing unit 110 has an exterior pane 10 and an interior pane 10' separated by a between-pane space 800. A spacer 900 (which can optionally be part of a sash) is commonly provided to separate the panes 10 and 10'. The spacer 900 can be secured to the interior surfaces of each pane using an adhesive or seal 700. In some cases, an end sealant 600 is also provided. In the illustrated embodiment, the exterior pane 10 has an exterior surface 12 (also known as the #1 surface) and an interior surface 14 (also known as the #2 surface). The interior pane 10' has an interior surface 16 (also known as the #3 surface) and an exterior surface 18 (also known as the #4 surface). The unit can optionally be mounted in a frame (e.g., a window frame) such that the exterior surface 12 of the exterior pane 10 is exposed to an outdoor environment 77 while the exterior surface 18 of the interior pane 10' is exposed to a room-side interior environment. Interior surfaces 14 and 16 are both exposed to the atmosphere in the between-pane space 800 of the insulating glazing unit.

In the embodiment of FIG. 7, the exterior surface 12 of pane 10 has the low-maintenance coating 80. In the embodiment of FIG. 8, the exterior surface 18 of pane 10' has the low-maintenance coating 80. In other embodiments, both of the exterior major surfaces of an IG unit can have low-maintenance coatings. The coating(s) 80 can be in accordance with any embodiment described in this disclosure. In certain cases, the coating 80 is any of the coatings described in Tables 1-5B. In other words, the coatings 1-5B in Tables 1-5B can be provided on exterior surface 12, exterior surface 18, or both. The interior surface 14 of pane 10 can optionally have a functional coating 70, such as a low-emissivity coating, a transparent conductive oxide coating, etc. The IG unit can have two, three or more panes.

Figure 9:
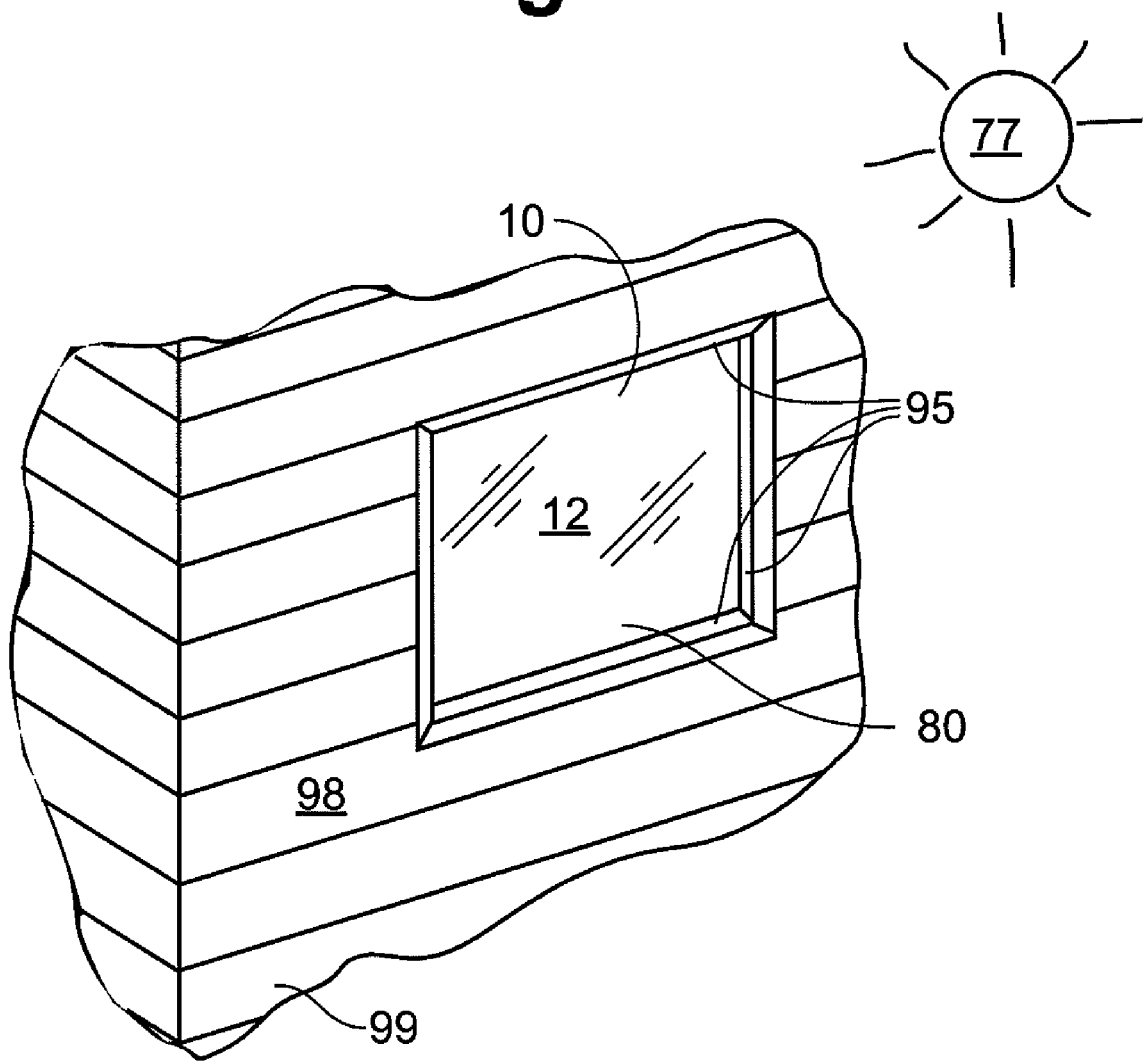
FIG. 9 is a partially broken-away perspective view of a window pane having a major surface carrying a low-maintenance coating, the pane being mounted in an exterior wall of a building in accordance with certain embodiments.

FIG. 9 exemplifies embodiments where the substrate 10 is a window pane mounted on a window frame 95 (e.g., in an exterior wall 98 of a building 99). In certain applications, the first surface of the window carries the low-maintenance coating 80. In some embodiments of this nature, coated surface 12 is exposed to an outdoor environment 77 (e.g., so as to be in periodic contact with rain).

The invention also provides several methods for producing low-maintenance products. Some of these methods include depositing the low-maintenance coating 80. In such methods, each film of the coating 80 can be deposited by a variety of well known coating techniques. Suitable coating techniques include, but are not limited to, chemical vapor deposition (CVD), plasma enhanced chemical vapor deposition, pyrolytic deposition, sol-gel deposition and sputtering. In preferred embodiments, the films are deposited by sputtering. Sputtering is well known in the present art.

Figure 10:
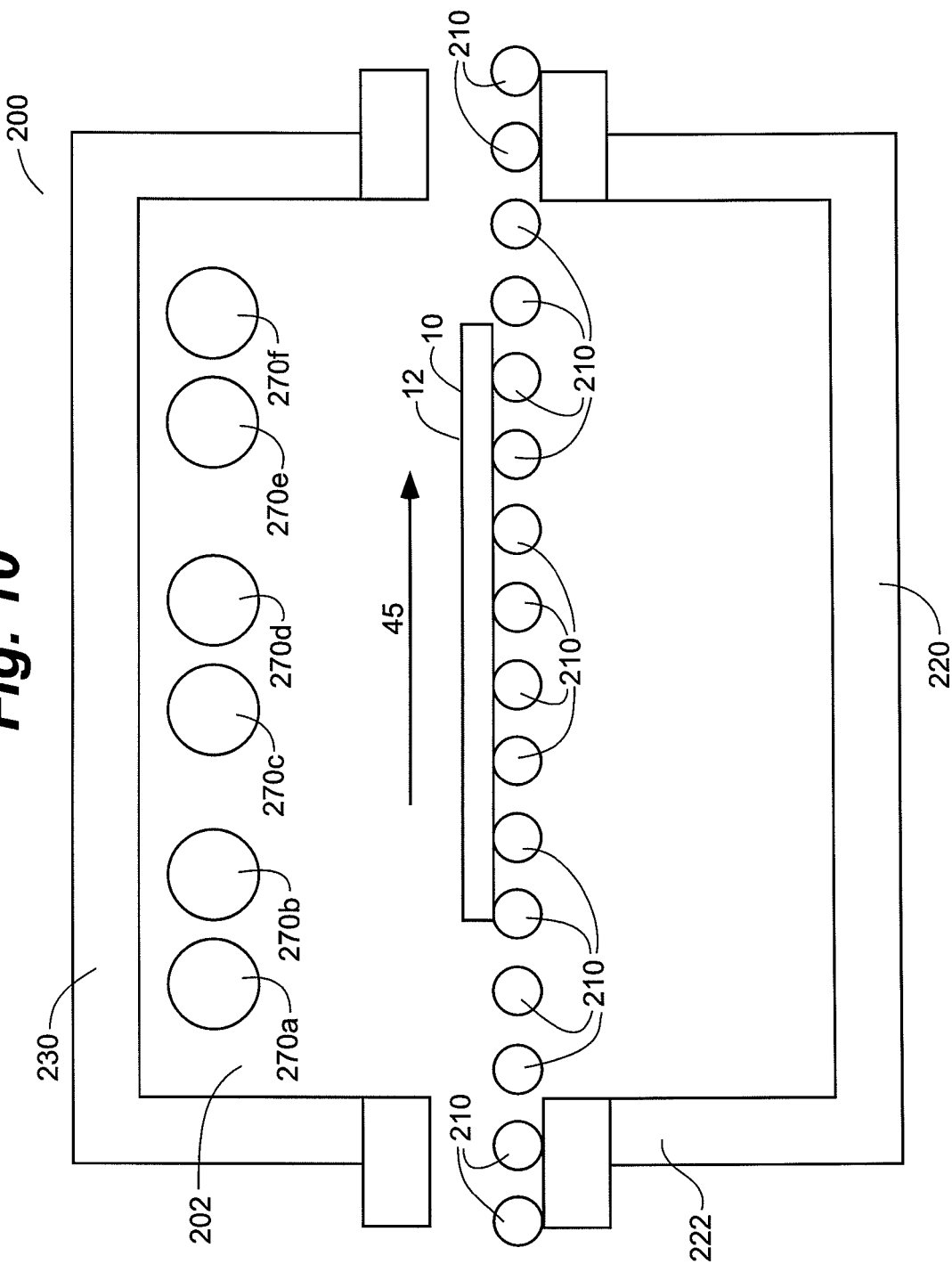
FIG. 10 is a schematic side view of a downward sputtering chamber adapted for use in certain methods.
Figure 11:
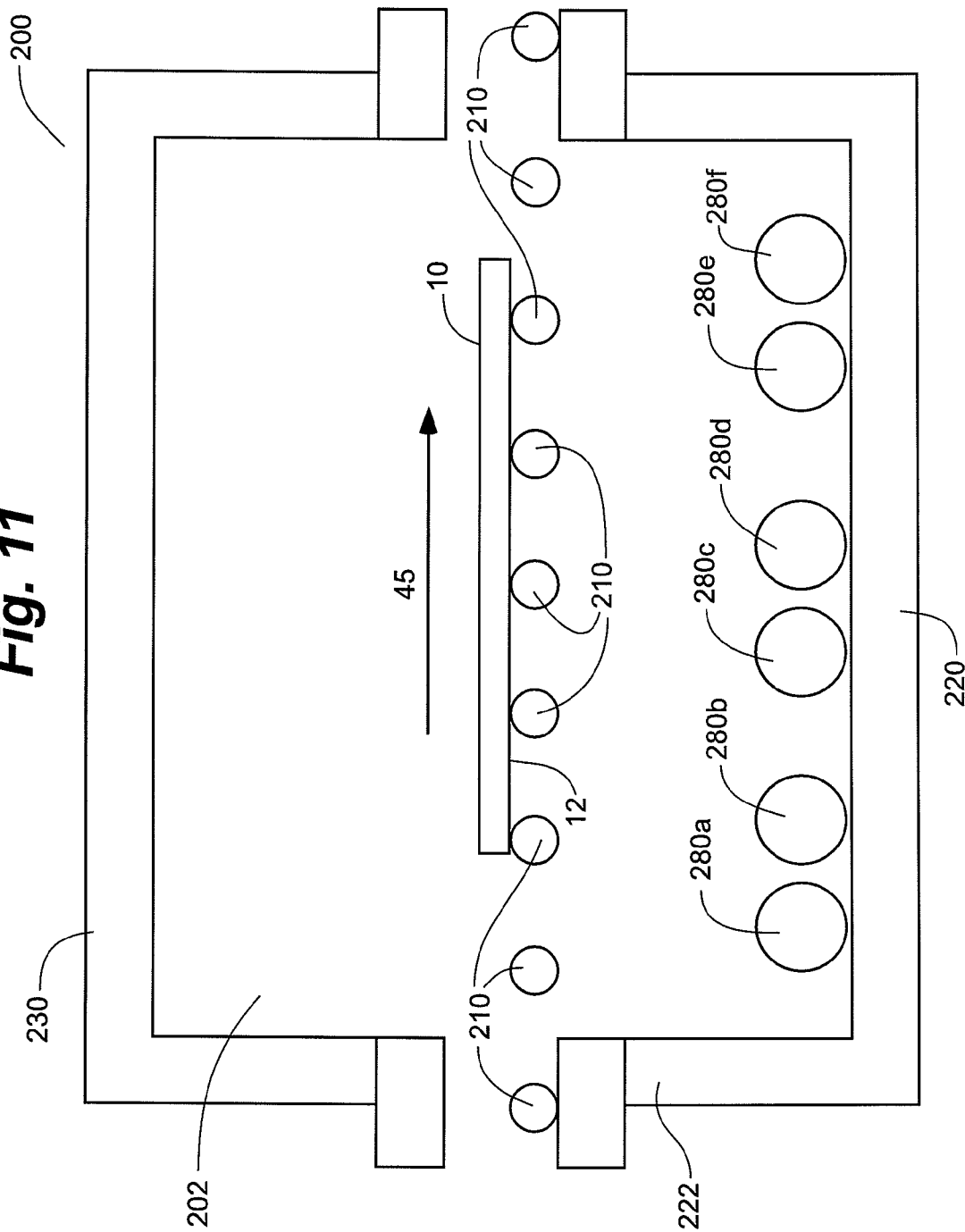
FIG. 11 is a schematic side view of an upward sputtering chamber adapted for use in certain methods.
Figure 12:
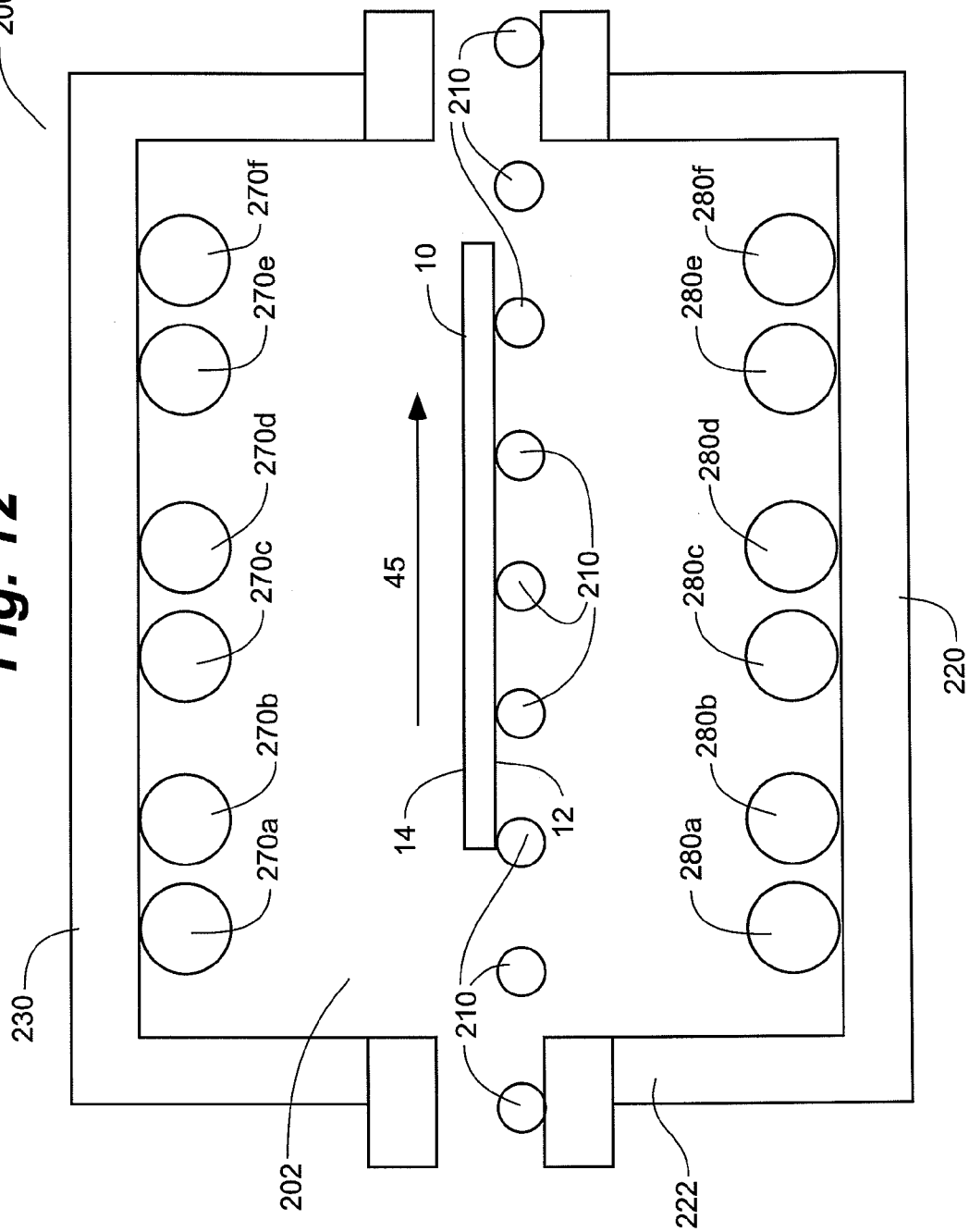
FIG. 12 is a schematic side view of a dual-direction sputtering chamber adapted for use in certain methods.

FIGS. 10-12 each schematically depict a coat zone 200 that can be used to deposit one or more films of the low-maintenance coating 80. FIGS. 10-12 depict six targets above and/or below the path of substrate travel in each coat zone. One or more of the adjacent target pairs, however, can be replaced with a single target, if so desired. In practice, each adjacent pair of targets may be in its own chamber (or "bay"), and the chambers may be grouped into separate coat zones. Since many different types of coaters can be used, these details are by no means limiting.

Magnetron sputtering chambers and related equipment are commercially available from a variety of sources (e.g., Applied Materials). Useful magnetron sputtering techniques and equipment are described in U.S. Pat. No. 4,166,018, issued to Chapin, the salient teachings of which are incorporated herein by reference. In FIGS. 10-12, each coat zone 200 is shown as being a single chamber that includes a base (or "floor") 220, a plurality of side walls 222, and a ceiling (or "top lid" or "cover") 230, together bounding a sputtering cavity 202. As noted above, though, the coat zone may actually comprise a series of chambers. The chambers can also be connected by a series of tunnels or inter-stage sections. The substrate 10 is conveyed along the path of substrate travel 45 during film deposition, optionally over a plurality of spaced-apart transport rollers 210.

In FIG. 10, upper targets 270a-270f are mounted above the path of substrate travel 45. Thus, the coat zone of FIG. 10 operates as a downward sputtering chamber. In FIG. 11, lower targets 280a-280f are mounted beneath the path of substrate travel 45. Thus, the coat zone of FIG. 11 operates as an upward sputtering chamber. In FIG. 12, both upper targets 270a-270f and lower targets 280a-280f are provided. Thus, one or more films of the low-maintenance coating 80 can be sputter deposited onto one side of the substrate, while one or more films of another functional coating 70 are simultaneously sputtered onto the other side of the substrate. Thus, the coat zone of FIG. 12 can operate as a dual-direction sputtering chamber. Dual-direction sputtering chambers are described in U.S. Pat. No. 6,964,731, the teachings of which concerning dual-direction sputtering chambers are incorporated herein by reference. FIGS. 10 and 11 each show six total targets, and FIG. 12 shows 12 total targets, but this is by no means required. Rather, any suitable number of targets can be provided, for example two targets or four targets. Moreover, FIGS. 10-12 show cylindrical targets, but planar targets can also be used (in combination with, or in place of, cylindrical targets).

In certain embodiments, the substrate 10 is subjected to one or more heat treatments. The substrate, for example, can optionally be heat treated before and/or after the low-maintenance coating has been deposited. The substrate can also be heat treated during deposition of the low-maintenance coating. For example, the substrate can optionally be heated in one or more chambers in which at least part of the film comprising titania is deposited. In certain embodiments, the substrate is heat treated after deposition of the inner portion 50a but before the deposition of the outer portion 50b. In other embodiments, the substrate is heat treated before deposition of the inner portion 50a and again before the deposition of the outer portion 50b. In still other embodiments, the substrate is heat treated after deposition of both the inner portion 50a and outer portion 50b. In further embodiments, the substrate is heat treated during deposition of the inner portion 50a and/or the outer portion 50b. In some embodiments, the low-maintenance coating 80 can include a base film 15 and the substrate is heat treated before, after, or during deposition of the base film 15. It is to be appreciated, however, that the low-maintenance coating is not required to undergo any heating before, during, or after deposition.

Figure 13:
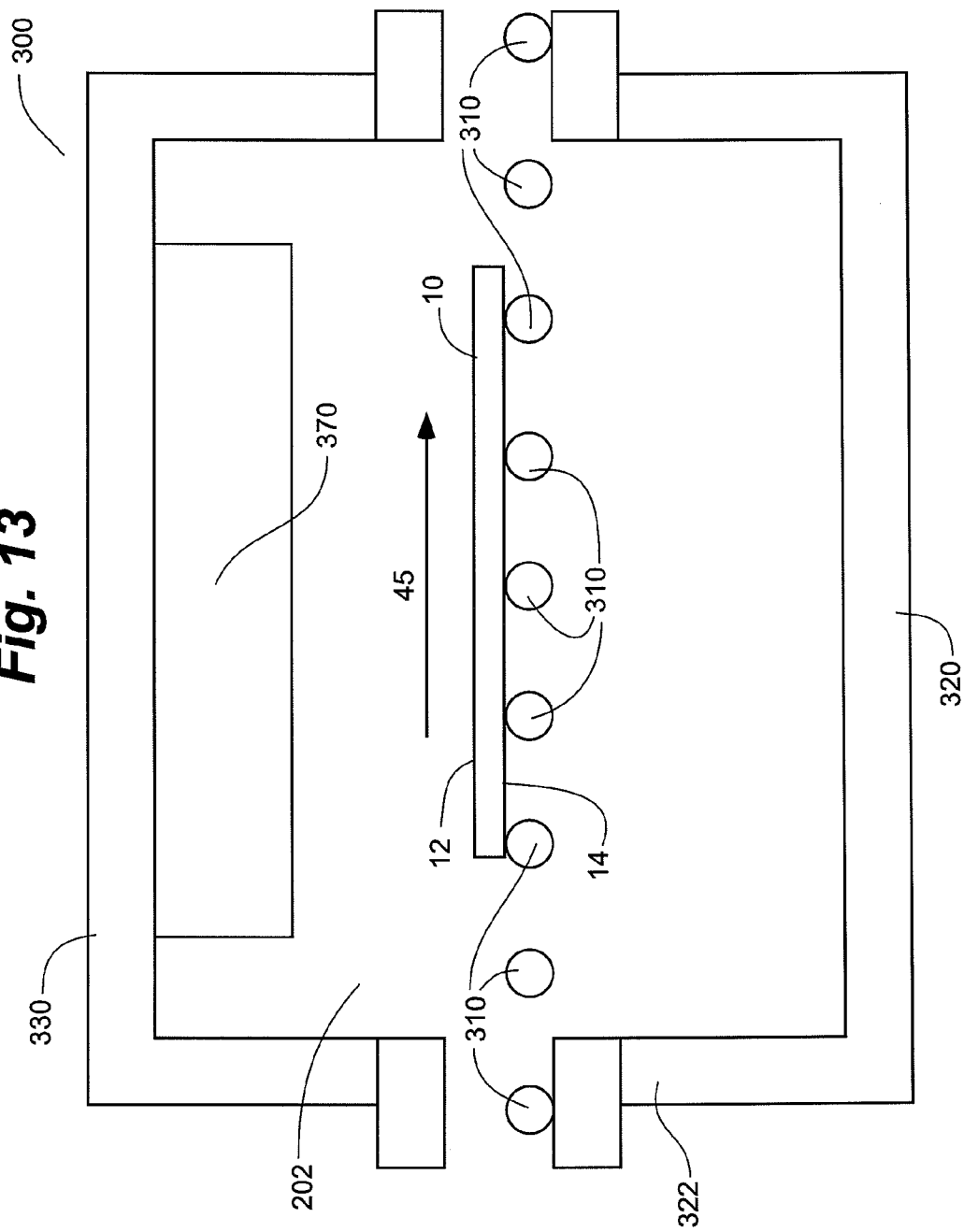
FIG. 13 is a schematic side view of a downward heating chamber adapted for use in certain methods.
Figure 14:
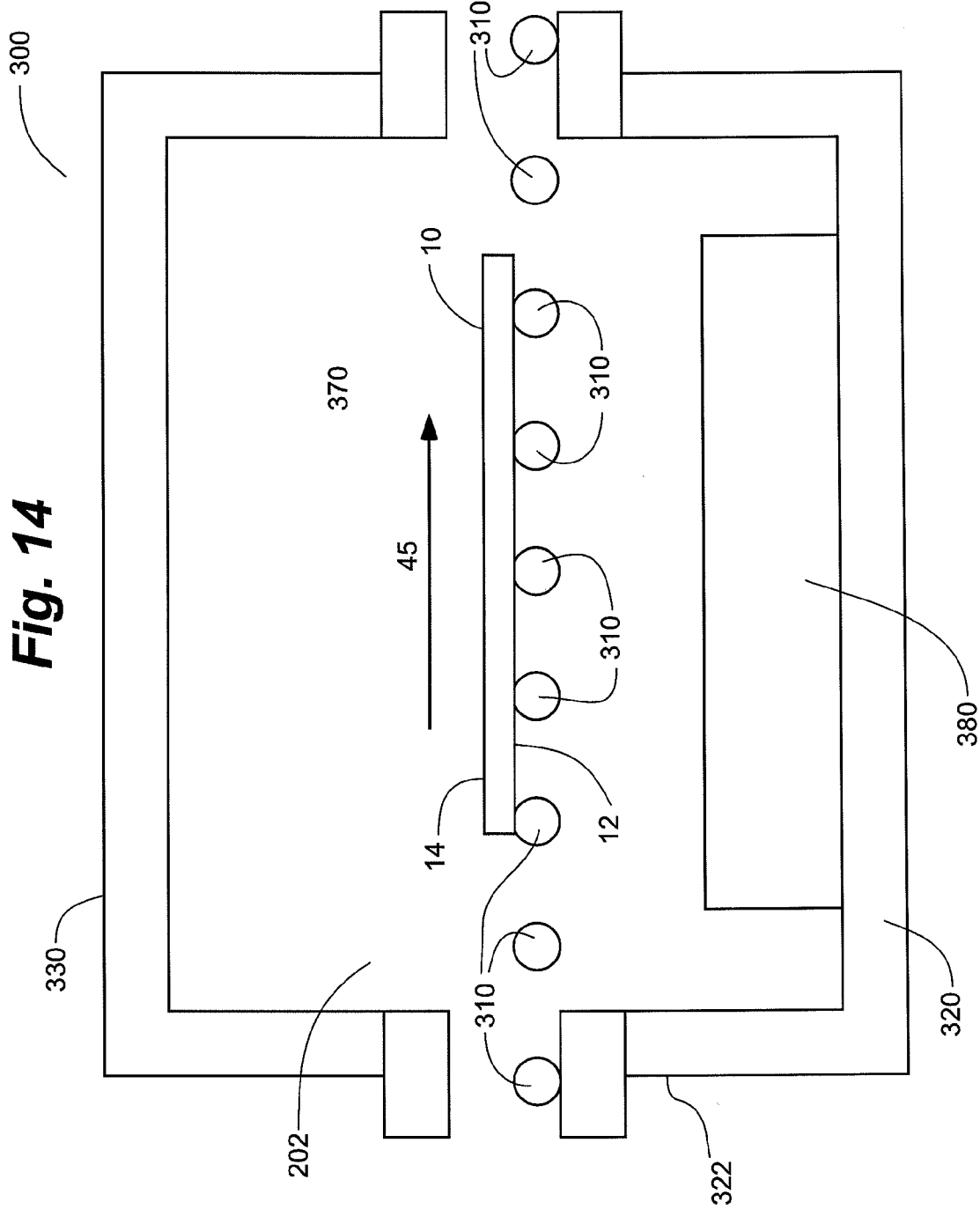
FIG. 14 is a schematic side view of an upward heating chamber adapted for use in certain methods.

In some embodiments, heat treatment occurs in a heating chamber that is part of a coater. Reference is made to FIGS. 13 and 14, which illustrate two exemplary heating chambers 300. Here, the heating chamber 300 includes a base (or "floor") 320, a plurality of side walls 322, and a ceiling (or "top lid" or "cover") 330, together bounding a heating cavity 202. When provided, the heating device 370, 380 is adjacent to the path of substrate travel. In FIG. 13, the heating device 370 is mounted above the path of substrate travel. The heating chamber of FIG. 13 may be particularly useful for heating a substrate on which a low-maintenance coating is deposited by downward sputtering, such as in a downward sputtering chamber (as illustrated by FIG. 10) or a dual-direction sputtering chamber (as illustrated by FIG. 12). In FIG. 14, the heating device 380 is mounted beneath the path of substrate travel. The heating chamber of FIG. 14 may be particularly useful for heating a substrate on which a low-maintenance coating is deposited by upward sputtering, such as in an upward sputtering chamber (as illustrated by FIG. 11) or a dual-direction sputtering chamber (as illustrated by FIG. 12). The heating device 370, 380 can also be used in conjunction with deposition methods other than sputtering.

The heating device 370, 380 can include any device known in the art for heating glass substrates or the like. The device 370, 380, for example, can be a resistance heater. In certain embodiments, the heating device includes ceramic heaters, such as radiant quartz heaters. One suitable heater is a High Intensity Quartz Faced Radiant Heater sold commercially by Chromalox, Inc., a corporation having its headquarters in Pittsburgh, Pa, USA. In other embodiments, flash lamps are used for heating. Ceramic infrared heaters are available from a variety of commercial suppliers, such as National Plastic Heater Sensor & Control Inc. (Scarborough, Ontario, Canada).

While FIGS. 13 and 14 illustrate heating chambers that perform the heat treating, heat treatments can instead (or additionally) be performed at other locations inside a coater. For example, the heat treatments can be performed inside a deposition chamber, such as inside a sputtering chamber. In some cases, a heating device is provided inside the deposition chamber to accomplish the heat treatment. For example, the heating device can be mounted below the path of substrate travel 45 in a downward deposition chamber (such as a downward sputtering chamber). As another alternative, the heating device can be mounted above the path 45 in an upward deposition chamber (such as an upward sputtering chamber). The heating device can be mounted at a position inside a deposition chamber upstream from where deposition takes place, downstream from where deposition takes place, or at a location where deposition takes place.

In other cases, heating occurs inside a deposition chamber by adjusting the deposition parameters to increase the temperature of the substrate. Methods of adjusting the deposition parameters are known to skilled artisans and need not be discussed in detail. In some cases, the deposition chamber is a sputtering chamber and helium or hydrogen can be added to the sputtering atmosphere. In other cases, AC sputtering can be used, rather than DC sputtering, so as to increase the temperature of the substrate. Thus, the substrate can optionally be heated in the deposition chamber(s) that deposit the film 50 comprising titania, and the heating may be caused at least in part by the sputtering process itself.

Figure 15:
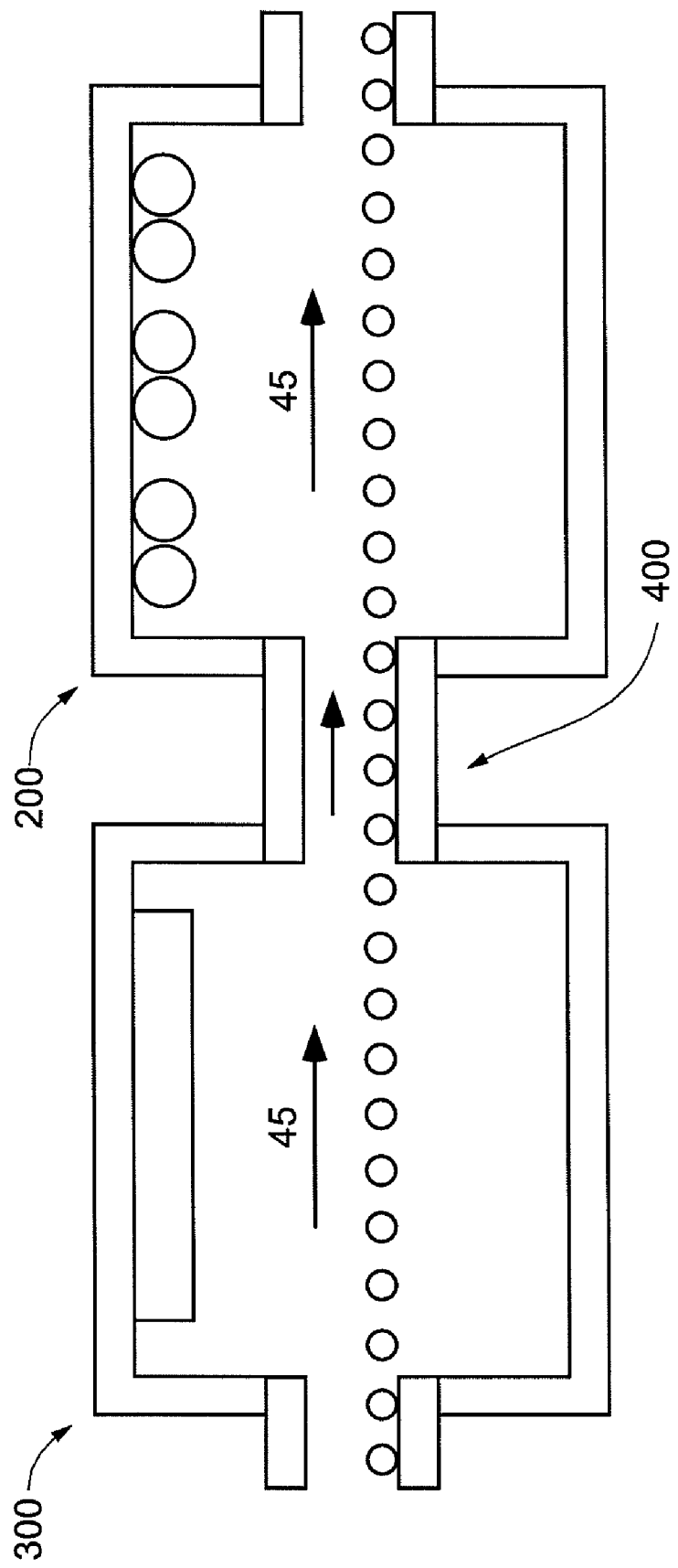
FIG. 15 is a schematic side view of an inter-stage section adapted for use in certain methods.

In other embodiments, heat treatment can take place at an inter-stage section 400 of a coater (i.e., in a non-deposition section between neighboring deposition chambers). In some cases, the inter-stage section 400 comprises a tunnel. FIG. 15 illustrates an inter-stage section 400 connecting a heating chamber 300 and a sputtering chamber 200. Skilled artisans will understand that the inter-stage section 400 can instead be connecting two sputtering chambers or other sections of a coater. Preferably, transport rollers extend from one chamber, through the inter-stage section 400, and into the next chamber. The substrate thus travels from one chamber to the next by passing through section 400. Typically, as substrates are transported from one chamber to the next, heat from the substrate is lost. Thus, in certain embodiments, the inter-stage section 400 is adapted to allow the substrate to retain heat, so that as the substrate is transported through it, heat loss is minimized. In some cases, a heating device is provided in the inter-stage section 400. In other cases, the inter-stage section 400 is heated by an external heating source, for example a radiant heater.

In certain embodiments, there is provided a production method wherein a low-emissivity coating is sputter deposited onto one major surface of the substrate, and thereafter at least part of the low-maintenance coating is deposited onto the other major surface of the substrate. In some embodiments of this nature, the sputter deposition of the low-emissivity coating heats the substrate, and the deposition of the low-maintenance coating is initiated while the substrate is still hot (i.e., before it has cooled to room temperature) from the sputtering of the low-emissivity coating. This may improve the photoactivity, hydrophilicity, morphology, or other characteristic of the low-maintenance coating.

Figure 16:
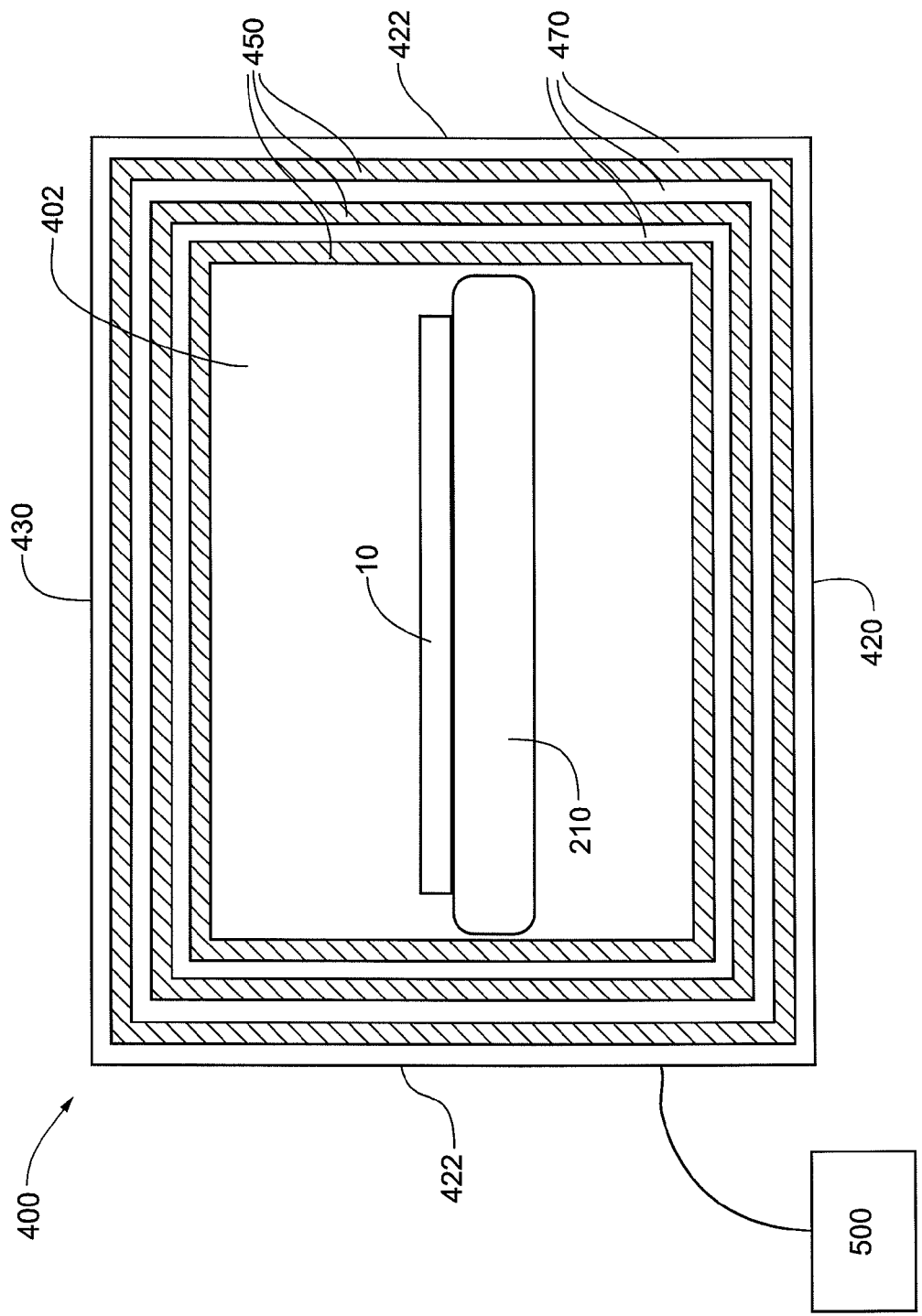
FIG. 16 is a front cross-section view of an inter-stage section adapted for use in certain methods.

In some embodiments, the inter-stage section 400 is fabricated of material that holds heat. FIG. 15 illustrates one embodiment of an inter-stage section 400 that is constructed so that it maintains heat. Referring to FIG. 16, section 400 can optionally have a base (or "floor") 420, side walls 422, and a ceiling 430, together bounding an interior space 402 that houses transport rollers 210 that transport a substrate 10. The base 420, side walls 422, and ceiling 430 form a rectangular tunnel, but other shapes, for example square and circular tunnels, are within the scope of the invention. Preferably, the base 420, side walls 422, and ceiling 430 are formed as a single piece, for example like a matchbox slip. In FIG. 16, the section 400 has a layered configuration, including layers of a conductive material 450 surrounded by layers of a ceramic material 470. In the illustrated embodiment, three layers of conductive material 450 and three layers of ceramic material 470 are shown, but any suitable number of layers can be provided. The layer of conductive material 450 can include any conductive metal, such as aluminum or copper. The layer of ceramic material 470 can include any dielectric that prevents heat from escaping outwards. Such ceramic may include silicon nitride, magnesium oxide, calcium oxide, zirconia, alumina, chromite, silicon carbide, carbon, and mullite. A heating source 500 can be provided, for example a radiant heater that applies heat to one or more of the conductive layers 450. Such a layered configuration may help to maintain the heat inside the exterior 402. In some embodiments, the interior space is maintained at a temperature of at least 160° F.

In certain cases, heating can take place at an "intermediate position" on the path of substrate travel. This so-called intermediate position is between an upstream location on the path 45 (where the inner portion 50a is deposited) and a downstream location on the path 45 (where the outer portion 50b is deposited). The intermediate position can be inside a sputtering chamber adapted for depositing at least part of the inner portion 50*a*, the position being located a point after such sputtering deposition has taken place. The intermediate position can also be inside a sputtering chamber adapted for depositing at least part of the outer portion 50*b*, the position being located a point before such sputtering deposition takes place. The intermediate position can alternatively be inside a heating chamber located between two sputtering chambers that respectively deposit the inner portion 50*a* and the outer portion 50*b*. The intermediate position can be inside an inter-stage section that connects sputtering chambers that respectively deposit the inner portion 50*a* and the outer portion 50*b*. Such heating can be accomplished, for example, by providing a heating device at the desired intermediate position(s).

Figure 17:
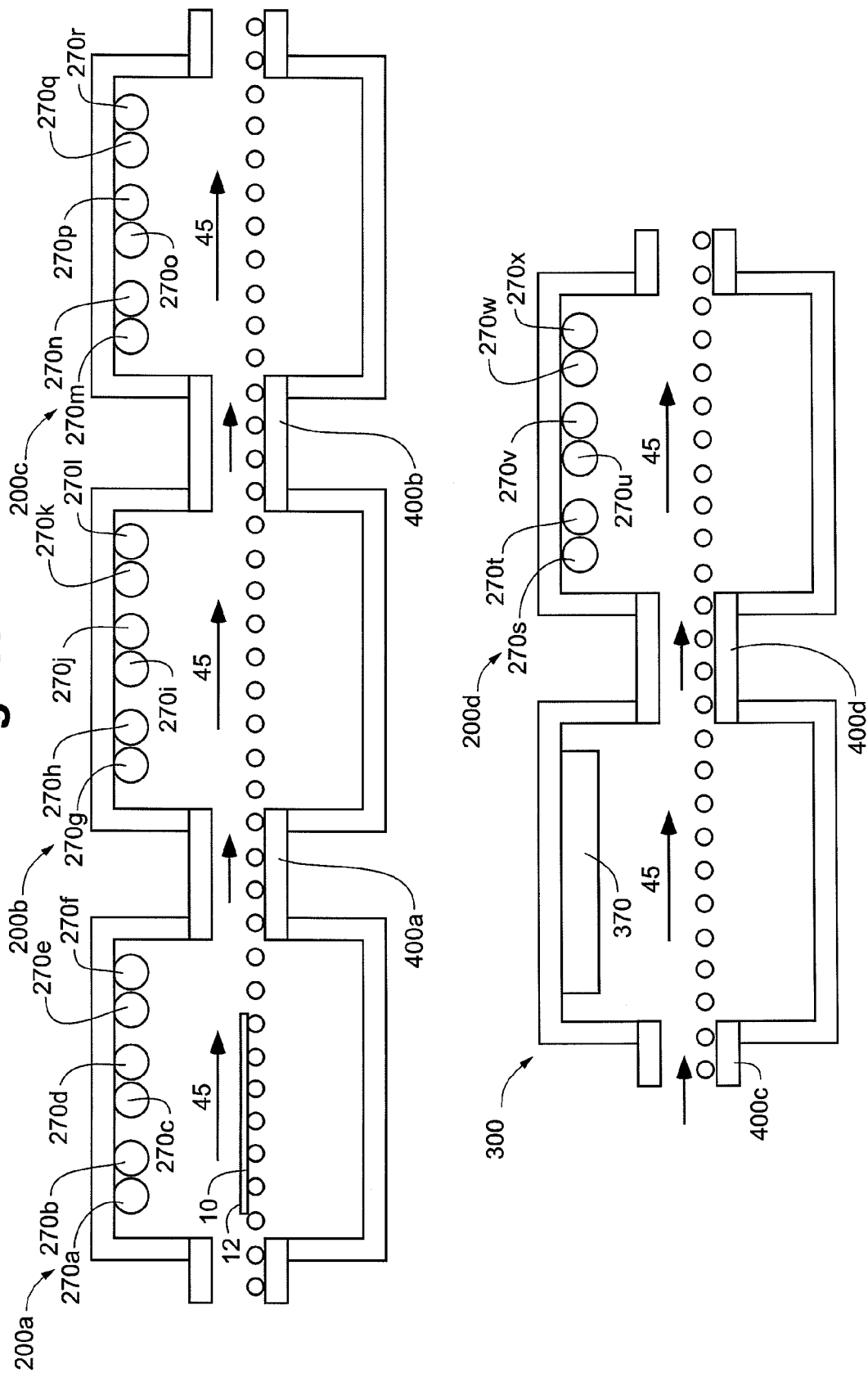
FIG. 17 is a schematic side view of a coating line, including downward sputtering chambers and a downward heating chamber, which is adapted for use in certain methods.
Figure 18:
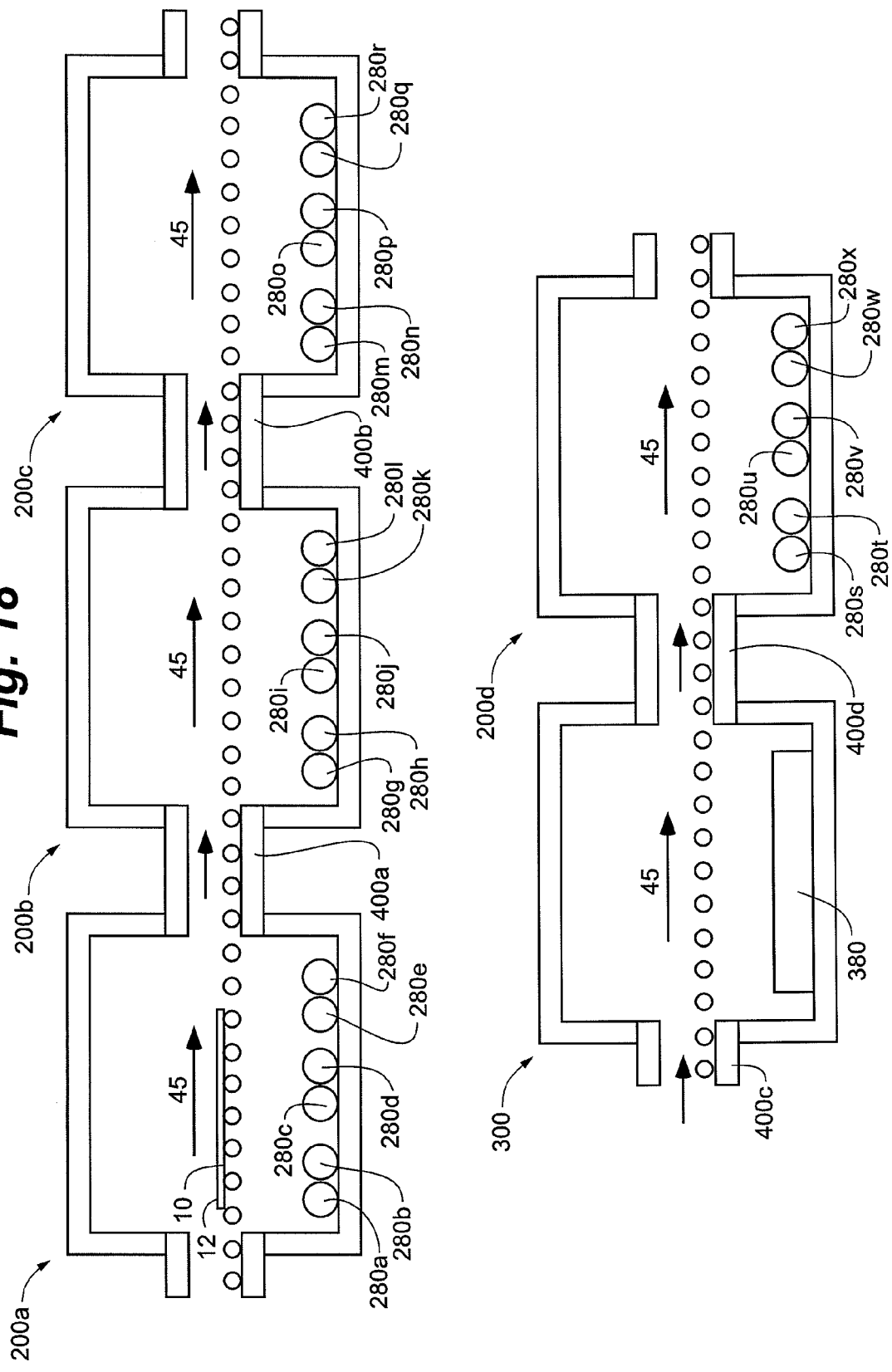
FIG. 18 is a schematic side view of a coating line, including upward sputtering chambers and an upward heating chamber, which is adapted for use in certain methods.

FIGS. 17 and 18 schematically illustrate two exemplary coaters that can be used to produce the low-maintenance coating, in accordance with certain embodiments. FIG. 17 illustrates a coater having downward coating chambers 200*a*, 200*b*, 200*c*, and 200*d* (shown here with upper sputtering targets 270*a*-270*x*) and a downward heating chamber 300 (with upper heating device 370). FIG. 18 illustrates a coater having upward coating chambers 200*a*, 200*b*, 200*c*, and 200*d* (shown here with lower sputtering targets 280*a*-280*x*) and an upward heating chamber (with lower heating device 380). A substrate is conveyed along the path of substrate travel 45 through the coater in the following order: coating chamber 200*a*, inter-stage section 400*a*, coating chamber 200*b*, inter-stage section 400*b*, coating chamber 200*c*, inter-stage section 400*c*, heating chamber 300, inter-stage section 400*d*, and coating chamber 200*d*. In certain embodiments, the coating chambers 200*a* and 200*b* are used to deposit a base film 15 and/or any intermediate films 20, and the coating chambers 200*c* and 200*d* are used to deposit the film comprising titania 50 (chamber 200*c* is used to deposit the inner portion 50*a*, and chamber 200*d* is used to deposit the outer portion 50*b*). Here, the heating chamber 300 is used to heat the substrate after the inner portion 50*a* has been deposited, but before the outer portion 50*b* is deposited. However, the heating chamber 300 can alternatively (or additionally) be provided at other locations in the coater, for example before chamber 200*a*, before chamber 200*b* (and after chamber 200*a*), before chamber 200*c* (and after chamber 200*b*), and/or after chamber 200*d*. If desired, additional coating chambers can be provided in embodiments where additional films are provided.

In certain embodiments, a base film 15 is deposited in coating chambers 200*a* and 200*b*. In these embodiments, the coating chambers 200*a* and 200*b* can optionally be provided with targets carrying the same sputterable material (270*a*-270*f*, 280*a*-280*f*). In other embodiments, the base film 15 is deposited in coating chamber 200*a* and an intermediate film 20 is deposited in coating chamber 200*b*. In these embodiments, the coating chamber 200*a* is provided with the same sputterable material (270*a*-270*f*, 280*a*-280*f*) for depositing a base film 15 and the coating chamber 200*b* is provided with another sputterable material (270*g*-270*l*, 280*g*-280*l*) for depositing an intermediate film 20.

The sputterable material can be a metal, a semi-metal, a compound of different metals, a compound of at least one metal and at least one semi-metal, etc., In such cases, an oxidizing atmosphere (optionally including some argon and/or nitrogen) may be used for sputtering. The targets can alternatively be ceramic (e.g., metal oxide), and an inert (or slightly oxidizing and/or slightly nitriding) atmosphere may be used. In embodiments where the base film 15 comprises silica, targets comprising silicon may be used. The targets comprising silicon, for example, may be silicon-aluminum targets. Likewise, in embodiments where the base film 15 comprises alumina, targets comprising aluminum can be used. In cases where the base film 15 is provided, it can alternatively comprise tin oxide, zirconium oxide, another dielectric, or a semiconductor.

In embodiments where the base film 15 is a mixed oxide film, a co-sputtering method can optionally be used. For example, some of the targets in a particular chamber can optionally comprise one sputterable material while other targets in the same chamber comprise another sputterable material. For example, if coating chamber 200*a* is used to deposit a base film 15, targets 270*a*, 270*c*, and 270*e* (or targets 280*a*, 280*c*, 280*e*) comprise material A and targets 270*b*, 270*d*, and 270*f* (or targets 280*b*, 280*d*, and 280*f*) comprise material B. Likewise, if both coating chambers 200*a* and 200*b* are used to deposit a base film 15, targets 270*a*, 270*c*, 270*e*, 270*g*, 270*i*, and 270*k* (or targets 280*a*, 280*c*, 280*e*, 280*g*, 280*i*, and 280*k*) comprise material A and targets 270*b*, 270*d*, 270*f*, 270*h*, 270*j*, and 270*l* (or targets 280*b*, 280*d*, 280*f*, 280*h*, 280*j*, and 280*l*) comprise material B.

The targets, for example, can be metal targets and an oxidizing atmosphere (optionally including argon and/or nitrogen) can be used. The targets can alternatively be ceramic, and an inert (or slightly oxidizing and/or slightly nitriding) atmosphere can be used. For example, in embodiments where the base film 15 is a mixed oxide film comprising silica and titania, material A can comprise silicon and material B can comprise titanium. Any intermediate film(s) 20 having a mixed oxide film can be deposited in the same manner as a mixed oxide base film.

With continued reference to FIGS. 17 and 18, once the base film 15 and/or any intermediate films 20 are deposited, the substrate travels through chamber 200*c*, where the inner portion 50*a* of the film comprising titania 50 is deposited. In embodiments where the inner portion 50*a* is a substantially homogenous film, the targets 270*m*-270*r*, 280*m*-280*r* can all carry the same sputterable material. These targets, for example, can be metal, and an oxidizing atmosphere can be used. The targets can alternatively be ceramic, and an inert (or slightly oxidizing) atmosphere can be used. In embodiments where the inner portion 50*a* consists essentially of titania, targets comprising titanium can be used. The targets comprising titanium can be titanium metal and an oxidizing atmosphere can be used, or titanium oxide targets can be used with an inert (or slightly oxidizing) atmosphere. When titanium oxide targets are used, they can optionally be substoichiometric titanium oxide targets, which are sold commercially by Bekaert NV (Deinze, Belgium).

In the exemplary embodiments of FIGS. 17 and 18, once the inner portion 50*a* is deposited in chamber 200*c*, the substrate 10 travels through a heating chamber 300, where a heater 370, 380 supplies heat to the substrate. Again, it is to be appreciated that the heater can be omitted, if so desired. The substrate then travels through coater 200*d*, where the outer portion 50*b* of the film 50 is deposited.

If the substrate is annealed glass, it may be preferred not to heat the glass to temperatures that will adversely affect the annealed state of the glass. For example, maximum glass temperatures below 350° F. are preferred, and temperatures below 250° F. are more preferred. In some embodiments, the substrate is heated to a maximum temperature of between 140° F. and 350° F., such as between about 170° F. and about 210° F. It is to be appreciated that the substrate is not required to be heated prior to or during deposition. Instead, the coated substrate may be heat treated after deposition. Or, the coated substrate may be produced without heat treatment.

In embodiments where the outer portion 50*b* comprises both titania and tungsten oxide, the targets (270*r*-270*w*, 280*r*-

280w) can each carry a sputterable material comprising both titanium and tungsten. In one group of embodiments, the sputterable material includes titanium and tungsten, wherein the titanium is in the form of metal titanium, titanium monoxide, titanium dioxide and/or titanium trioxide, and the tungsten is in the form of metal tungsten, tungsten oxide, tungsten dioxide, and/or tungsten trioxide. In some cases, the sputterable material comprises both titanium and tungsten in a variety of the above forms.

In certain embodiments, the sputterable material consists essentially of titanium metal and tungsten metal. An alloy target comprising both titanium and tungsten could be used. Or, one could use a metal titanium target provided with strips (or the like) of metal tungsten. Another possibility is a metal alloy target with tungsten metal strips attached. When metal targets are sputtered, an oxidizing atmosphere (optionally with a slight amount of nitrogen) can be used. In other cases, the sputterable material comprises both titanium oxide and tungsten oxide. In these cases, an inert atmosphere or slightly oxidizing atmosphere (optionally with a slight amount of nitrogen) can be used. In certain embodiments, the sputterable material comprises titanium monoxide, titanium dioxide, and tungsten oxide. In these cases, a slightly oxidizing atmosphere (optionally with a slight amount of nitrogen) can be used. Or, the targets could be sputtered in an inert atmosphere, e.g., if the resulting film is not required to be fully oxidized. In certain cases, the sputterable material is characterized by a metal-only atomic ratio of between about 0.01 and 0.34, this ratio being the number of tungsten atoms in the sputterable material divided by the number of titanium atoms in the sputterable material.

A target with sputterable material comprising both titanium and tungsten can be prepared using a number of different methods. In some embodiments, a target is prepared by plasma spraying titanium oxide together with tungsten metal onto a target base in an atmosphere that is oxygen deficient and does not contain oxygen-containing compounds. During the plasma spraying process, the action of the plasma on the titanium oxide causes the titanium oxide to lose some oxygen atoms from their lattices. These oxygen atoms are believed to combine with the metal tungsten to form tungsten oxide, as tungsten has a high electrochemical potential. The titanium oxide sprayed onto the backing tube may thus comprise titanium monoxide, titanium dioxide, and tungsten oxide. The sputterable target may, as just one example, be a cylindrical rotary target having a backing tube with a length of at least 24 inches. In such cases, the sputterable material is carried on an exterior wall of the backing tube. Such a cylindrical target is also adapted to rotate about a central axis to which the exterior wall of the backing tube is substantially parallel. Alternatively, hot isostatic pressing may be used to form a target. Other target forming methods may also be used.

When the outer portion 50b is deposited by sputtering one or more targets comprising substoichiometric TiOx, the sputtering is preferably carried out using argon, a mixture of argon and oxygen, a mixture of nitrogen and argon, a mixture of nitrogen and oxygen, or a mixture of oxygen, nitrogen, and argon. If the plasma gas does not contain oxygen, e.g., if pure argon is used, then the coating will not be fully oxidized when deposited. In contrast, if the plasma gas contains oxygen, then the reduced form(s) of titanium oxide may be converted during the sputtering process into the transparent form, which is stoichiometric or substantially stoichiometric. A film comprising titania and tungsten oxide can be produced in this way. The degree of transparency of the film will depend upon the amount of oxygen contained in the plasma gas. An exemplary gas mixture to form transparent film is 70-90% by volume argon and 30-10% by volume of oxygen. In some cases, the gas mixture can include 1-3% by volume oxygen, with the remainder being argon.

In embodiments where the outer portion 50b is a film comprising both titania and tungsten oxide, a co-sputtering method can optionally be used. For example, one target can comprise titanium metal while an adjacent target comprises tungsten metal. For example, targets 270s, 270u, and 270w (or targets 280s, 280u, and 280w) can each comprise material A, while targets 270t, 270v, and 270x (or targets 280t, 280v, and 280x) each comprise material B, and one of material A or B can comprise titanium while the other of materials A and B comprises tungsten. As still another option, the targets used to deposit the outer portion 50b can carry a sputterable metallic material that is a compound (e.g., an alloy) comprising both titanium metal and tungsten metal.

After the substrate has been coated with the low-maintenance coating 80, the coated substrate can optionally be subjected to a post-deposition heat treatment. In certain embodiments, the coated substrate is positioned in a heating chamber for at least 60 seconds, during which time the heating chamber is maintained at a temperature of at least 650° C. Preferably, the heat treatment brings the coated substrate to a temperature of at least about 640° C. After heat treatment, the substrate is cooled back down to room temperature, at which point the coated substrate preferably exhibits a haze of less than 0.4 (more preferably less than 0.2, or even less than 0.15) after heat treatment.

Some exemplary film stacks and deposition methods will now be described, in accordance with certain embodiments.

EXAMPLE #1

Figure 19:
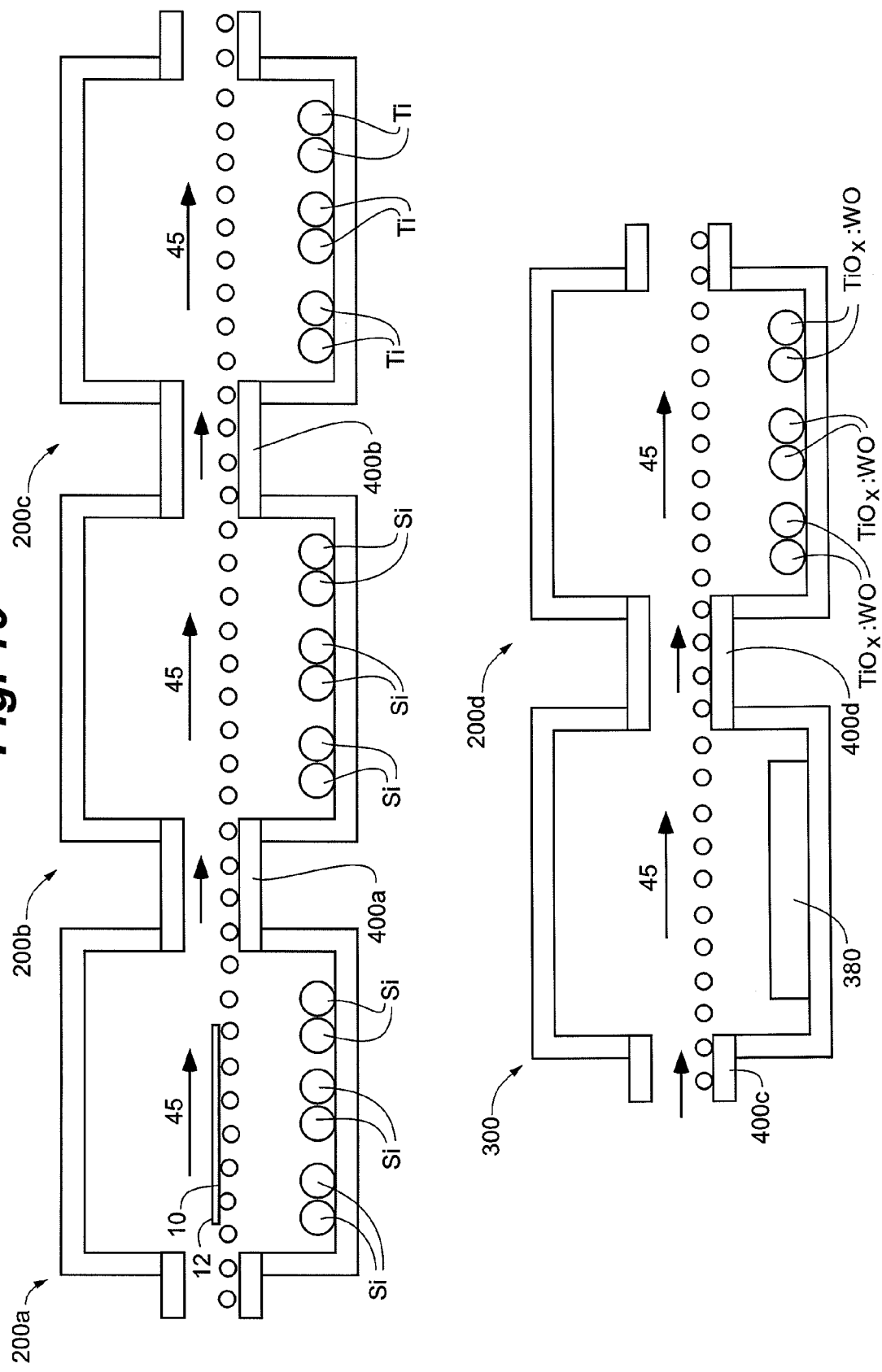
FIG. 19 is a schematic side view of a coating line, including upward sputtering chambers and an upward heating chamber, which is adapted for use in certain methods.

The coating shown in Table 1 ("Coating #1) was deposited according to the following method. A soda-lime glass substrate was transported through the coating line shown in FIG. 19. Chambers 200a and 200b each have six lower silicon targets (each including a small amount of aluminum). An oxidizing atmosphere was provided in each chamber and the silicon targets were sputtered upwardly to deposit a base film comprising silica on the surface 12 of the substrate. The base film had a thickness of about 70 Å. Next, the substrate was transported through another chamber 200c, which had six lower titanium metal targets. An oxidizing atmosphere was provided, and the titanium targets were sputtered upwardly to deposit the inner portion 50a of a film comprising titania on the base film. The inner portion consisted essentially of titanium oxide, and had a thickness of about 25 Å. Next, the substrate was transported through a heating chamber 300 having a lower heater 380 for heating the substrate. The heater 380 was a High Intensity Quartz Faced Radiant Heater, obtained from Chromalox, Inc. (When a heater is used, however, it may be desirable to use a heater that operates by other than radiative heating.) In this example, the chamber 300 was actually an inter-stage chamber located between coat zones 200c and 200d. Next, the substrate was transported through a chamber 200d having six lower targets each carrying a sputterable material comprising both titania and tungsten oxide. An atmosphere of argon and oxygen was provided, and the targets were sputtered upwardly to deposit the outer portion 50b of the film 50 on the inner portion 50a. The outer portion 50b consisted essentially of titania and tungsten oxide, and it had a thickness of about 40-45 Å. The substrate was conveyed through these chambers and the heating chamber at a speed of about 250 inches per minute.

Once the coating was deposited, the glass was tempered in a manner believed to yield acceptable tempering in a commercial production setting. In particular, the coated glass was washed using standard washing equipment and placed in a furnace maintained at about 680-705° C. (preferably controlled to 690-700° C.). The coated glass was held in the furnace for 100-120 seconds with constant movement to better ensure temperature uniformity, so as to raise the glass temperature to about 640° C. The glass was then removed from the furnace and positioned in a stream of air for about 50 seconds until the glass was cool enough for an operator to handle. The haze of the tempered glass was measured using a hazometer sold by BYK Gardner under the trade name Haze-Gard Plus and a reading of 0.12 was obtained.

EXAMPLE #2

Figure 20:
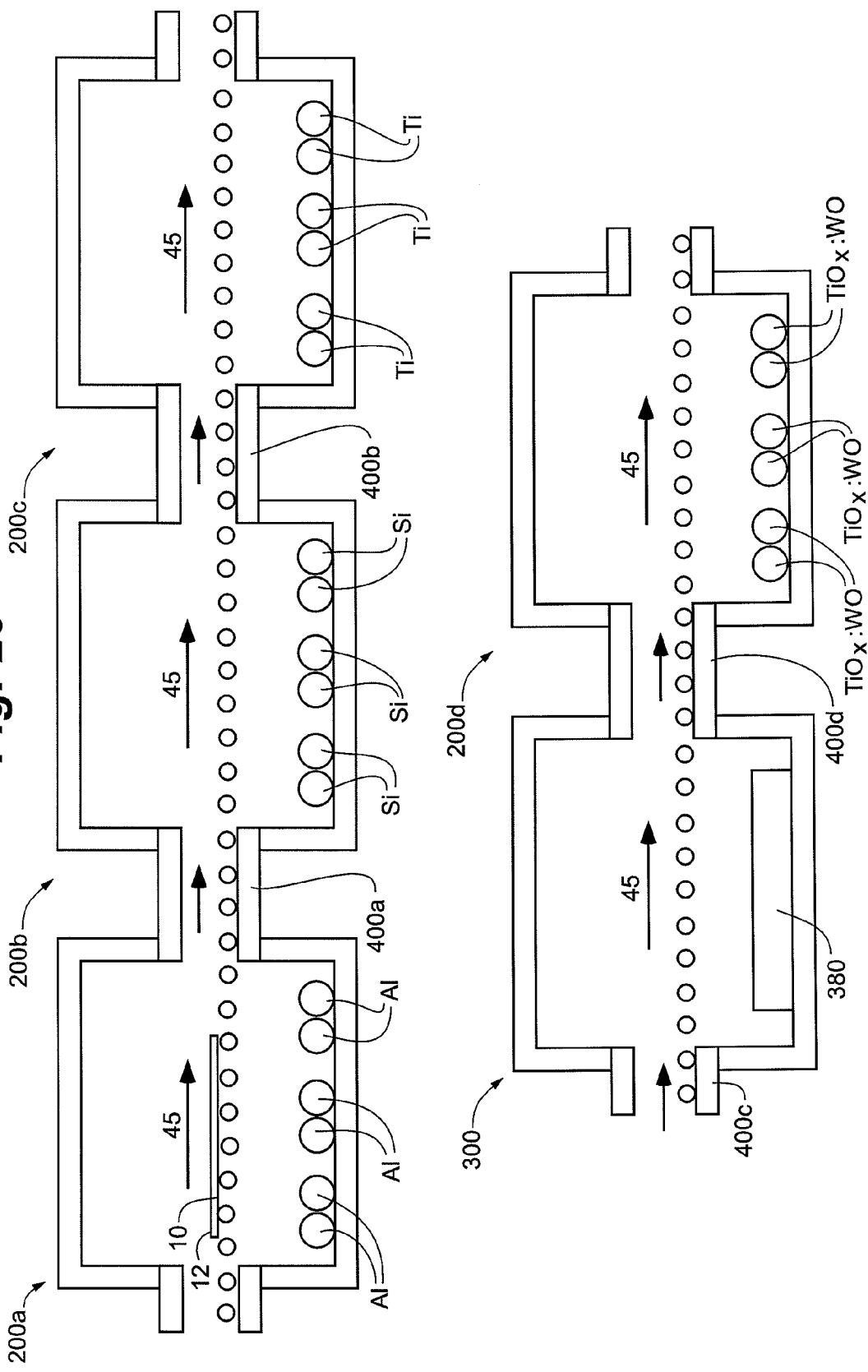
FIG. 20 is a schematic side view of a coating line, including upward sputtering chambers and an upward heating chamber, which is adapted for use in certain methods.

The coating shown in Table 3 ("Coating 3"), can be deposited according to the following method. A soda-lime glass substrate can be transported through the coating line shown in FIG. 20. Chamber 200a has six lower aluminum targets and an oxidizing atmosphere can be provided. The aluminum targets can be sputtered upwardly to deposit a base film comprising alumina on the surface 12. The base film can have a thickness of about 30 Å. Next, the substrate can be transported through another chamber 200b, which can include six lower silicon targets. An oxidizing atmosphere can be provided and the silicon targets can be sputtered upwardly to deposit an intermediate film comprising silica directly onto the base film. Next, the substrate can be transported through another chamber 200c, which can include six lower titanium metal targets. An oxidizing atmosphere can be provided, and the titanium targets can be sputtered upwardly to deposit an inner portion 50a of a film comprising titania on the intermediate film. The inner portion can have a thickness of about 25 Å. Next, the substrate can be transported through an optional heating chamber 300 having a lower heater 380 for heating the substrate. Next, the substrate can be transported through a chamber 200d having six lower targets each carrying a sputterable material comprising both titania and tungsten oxide. An atmosphere of argon and oxygen can be provided, and the targets can be sputtered upwardly to deposit the outer portion 50b. The outer portion 50b can have a thickness of about 40-45 Å. The substrate can be conveyed through these chambers at a speed of about 250 inches per minute. Once the coating is deposited, the glass can optionally be tempered in a manner believed to yield acceptable tempering in a commercial production setting.

COMPARATIVE EXAMPLE

A coating having an outer film of titanium dioxide was prepared, and is illustrated in Table 6 ("Comparative Coating #6").

TABLE 6

| (Comparative Coating #6) | | |
| --- | --- | --- |
| Component | Material | Thickness |
| Outer Film | Titanium Oxide | 25-40 Å |
| Base Film | Silica | 75 Å |
| Substrate | Glass | — |

Figure 21:
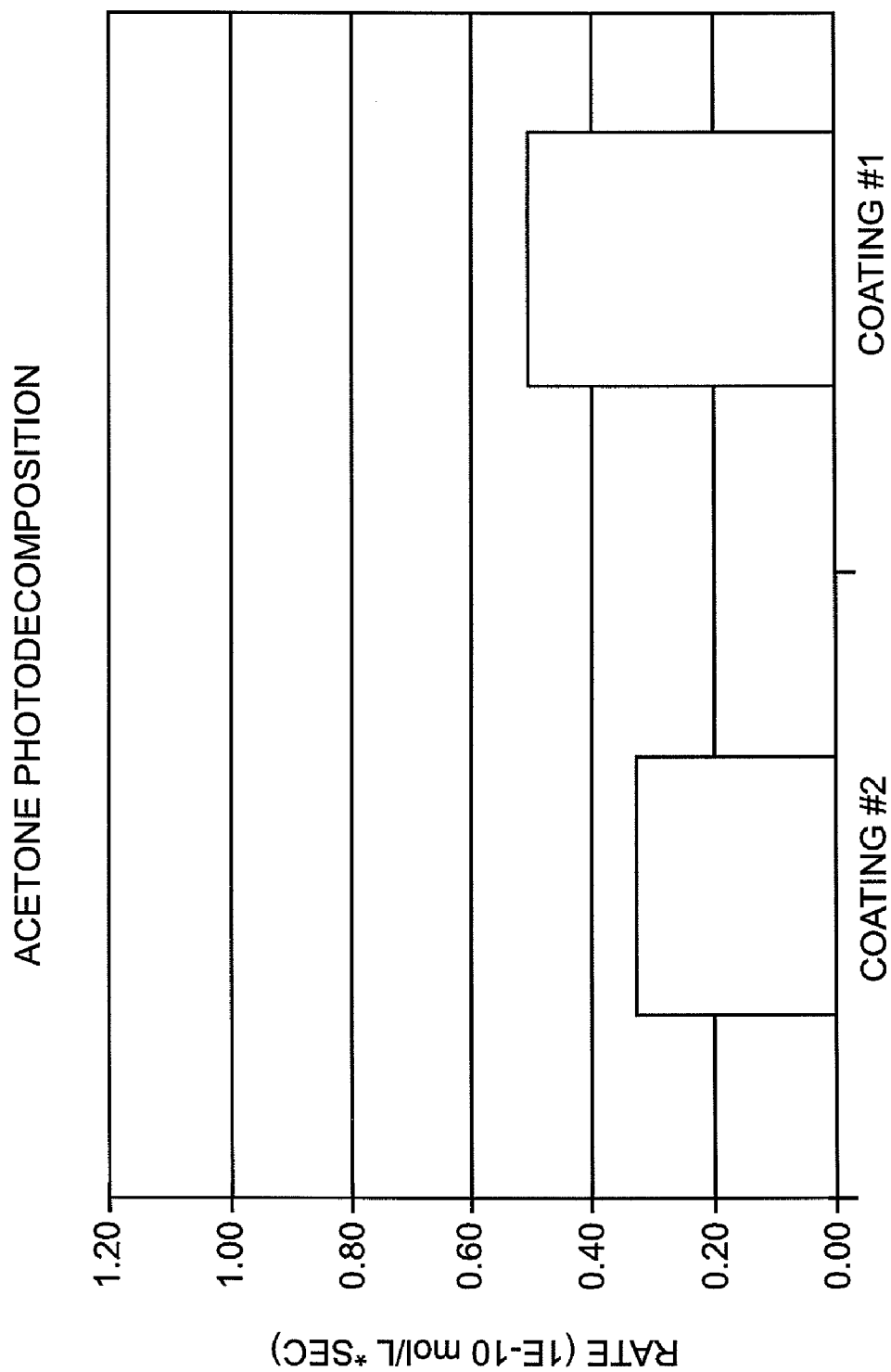
FIG. 21 is a chart illustrating the rate of acetone photodecomposition for two coatings.

A rate of acetone photodecomposition was determined for Coating #1 and for Comparative Coating #6. The results are illustrated in FIG. 21. The rates were determined using a standard Fourier-transform infrared spectrometer (FTIR), which monitored a loss of acetone due to photocatalytic activity. As shown, Coating #1 showed a rate of acetone photodecomposition of about 2, whereas the Comparative Coating #6 showed a rate of about 1.25.

While certain preferred embodiments of the invention have been described, it should be understood that various changes, adaptations and modifications can be made without departing from the spirit of the invention and the scope of the appended claims.

What is claimed is:

1. A substrate having a major surface on which there is a low-maintenance coating, the low-maintenance coating including a thickness of film comprising titania, said thickness being less than 250 Å, wherein only part of that thickness includes tungsten oxide, said thickness including an inner portion and an outer portion, the inner portion being closer to the substrate than is the outer portion, the outer portion being the part that includes tungsten oxide, wherein the outer portion defines an exposed, outermost face of the low-maintenance coating, wherein the coating has a region ratio of between about 0.2 and 7, the region ratio being the thickness of the outer portion divided by the thickness of the inner portion, and wherein said coated substrate has a haze value of less than 0.30.

2. The substrate of claim 1 wherein the thickness of the outer portion is no more than about 90 Å.

3. The substrate of claim 1 wherein said thickness of film comprising titania is less than about 150 Å.

4. The substrate of claim 1 wherein the outer portion is a substantially homogenous film comprising both titanium dioxide and tungsten oxide.

5. The substrate of claim 4 wherein the inner portion is a substantially homogenous film consisting essentially of titania.

6. The substrate of claim 1 wherein the outer portion has a tungsten load characterized by a metal-only atomic ratio of between about 0.01 and about 0.34, this ratio being the number of tungsten atoms in the outer portion divided by the number of titanium atoms in the outer portion.

7. The substrate of claim 1 wherein the low-maintenance coating includes a base film between the major surface of the substrate and said thickness of film comprising titania.

8. The substrate of claim 7 wherein the base film and said thickness of film comprising titania have a combined thickness of less than about 150 Å.

9. The substrate of claim 7 wherein the base film comprises silica.

10. The substrate of claim 7 wherein the base film comprises alumina.

11. The substrate of claim 7 wherein the base film has a thickness of less than about 100 Å.

12. The substrate of claim 1 wherein a base film is provided between said thickness of film comprising titania and the major surface of the substrate, and an intermediate film is provided between the base film and said thickness of film comprising titania.

13. The substrate of claim 12 wherein the base film and the intermediate film each have a thickness of less than 100 Å.

14. The substrate of claim 13 wherein base film comprises alumina and the intermediate film comprises silica.

15. The substrate of claim 14 wherein the base film comprises alumina at a thickness of less than about 50 Å and the intermediate film comprises silica at thickness of less than about 50 Å.

16. The substrate of claim 1 wherein a transparent conductive oxide film is provided between the major surface of the substrate and the low-maintenance coating.

17. The substrate of claim 16 wherein the substrate is a transparent pane that is part of a multiple-pane insulating glazing unit having a between-pane space, wherein the major surface bearing the low-maintenance coating faces away from the between-pane space of the unit.

18. The substrate of claim 1 wherein the substrate is part of a triple-pane insulating glazing unit.

19. The substrate of claim 1 wherein the substrate is part of a multiple-pane insulating glazing unit having two exterior major surfaces each bearing a low-maintenance coating comprising titania.

20. A substrate having a major surface on which the following films are coated in sequence, moving outwardly from the major surface:
   i) a functional film comprising a material selected from the group consisting of indium tin oxide and fluorine-containing tin oxide; and
   ii) a thickness of film comprising titania, wherein only part of that thickness includes tungsten oxide, said thickness including an inner portion and an outer portion, the inner portion being closer to the substrate than is the outer portion, the outer portion being the part that includes tungsten oxide, wherein the outer portion defines an exposed, outermost face, and wherein a thickness ratio defined as said thickness of film comprising titania divided by the thickness of the functional film is between about 0.004 and about 0.08, and wherein a region ratio defined as the thickness of the outer portion divided by the thickness of the inner portion is between about 0.2 and 7.

21. The substrate of claim 20 wherein said thickness ratio is between about 0.004 and about 0.025.

22. The substrate of claim 20 wherein between the functional film and said thickness of film comprising titania there is a layer having a thickness of less than 100 Å.

23. The substrate of claim 20 wherein between the functional film and said thickness of film comprising titania there is a layer comprising silica, alumina, or both.

24. The substrate of claim 20 wherein between the functional film and said thickness of film comprising titania there are two layers of film having a combined thickness of less than 100 Å.

25. A substrate having a major surface on which there is both a transparent conductive oxide film and a low-maintenance coating, the transparent conductive oxide film being closer to the substrate than is the low-maintenance coating, the low-maintenance coating including a thickness of film comprising titania, wherein only part of that thickness includes tungsten oxide, said thickness including an inner portion and an outer portion, the inner portion being closer to the substrate than is the outer portion, the outer portion being the part that includes tungsten oxide, wherein the outer portion defines an exposed, outermost face of the low-maintenance coating, wherein a region ratio defined as the thickness of the outer portion divided by the thickness of the inner portion is between about 0.2 and 7, wherein between the transparent conductive oxide film and said thickness of film comprising titania there are two layers including one comprising silica and one comprising alumina.

26. The substrate of claim 25 wherein said two layers have a combined thickness of less than 100 angstroms.

27. The substrate of claim 25 wherein said layer comprising alumina is closer to the substrate than is said layer comprising silica.

28. The substrate of claim 25 wherein said layer comprising alumina is contiguous to said layer comprising silica.

29. The substrate of claim 25 wherein the substrate is a transparent pane that is part of a multiple-pane insulating glazing unit having a between-pane space, wherein the major surface bearing the transparent conductive oxide film and the low-maintenance coating faces away from the between-pane space of the unit.

\* \* \* \* \*